(12) United States Patent
Shiraishi

(10) Patent No.: US 8,406,538 B2
(45) Date of Patent: Mar. 26, 2013

(54) IMAGE PROCESSING APPARATUS AND IMAGE PROCESSING METHOD

(75) Inventor: Naoto Shiraishi, Kanagawa (JP)

(73) Assignee: Ricoh Company, Limited, Tokyo (JP)

( * ) Notice: Subject to any disclaimer, the term of this patent is extended or adjusted under 35 U.S.C. 154(b) by 164 days.

(21) Appl. No.: 13/097,762

(22) Filed: Apr. 29, 2011

(65) Prior Publication Data

US 2011/0280492 A1 Nov. 17, 2011

(30) Foreign Application Priority Data

May 14, 2010 (JP) .................................. 2010-112575

(51) Int. Cl.
 *G06K 9/36* (2006.01)
(52) U.S. Cl. ....................................................... 382/232
(58) Field of Classification Search .......... 382/232–253; 341/50, 51, 65, 67, 87, 106; 358/1.9, 426.01–426.16; 707/693
See application file for complete search history.

(56) References Cited

U.S. PATENT DOCUMENTS

| | | | | |
|---|---|---|---|---|
| 5,406,281 | A * | 4/1995 | Klayman | 341/51 |
| 5,828,378 | A | 10/1998 | Shiraishi | |
| 5,903,276 | A | 5/1999 | Shiraishi | |
| 6,529,912 | B2 * | 3/2003 | Satoh et al. | 707/693 |
| 6,876,774 | B2 * | 4/2005 | Satoh et al. | 382/245 |
| 6,915,017 | B2 | 7/2005 | Shiraishi | |
| 6,941,023 | B2 | 9/2005 | Shiraishi | |
| 7,009,622 | B2 | 3/2006 | Shiraishi | |
| 7,079,691 | B2 | 7/2006 | Shiraishi | |
| 7,233,702 | B2 | 6/2007 | Shiraishi | |
| 7,359,557 | B2 | 4/2008 | Shiraishi | |
| 7,454,528 | B2 | 11/2008 | Kanoshima et al. | |
| 7,456,985 | B2 | 11/2008 | Shiraishi | |
| 7,483,586 | B2 | 1/2009 | Shiraishi | |
| 7,535,614 | B1 | 5/2009 | Tapley | |
| 2005/0246684 | A1 | 11/2005 | Shiraishi | |
| 2009/0051942 | A1 | 2/2009 | Kanoshima et al. | |
| 2009/0060325 | A1 | 3/2009 | Shiraishi | |
| 2009/0128857 | A1 | 5/2009 | Shiraishi | |

FOREIGN PATENT DOCUMENTS

| | | |
|---|---|---|
| JP | 3240495 | 10/2001 |
| JP | 4000266 | 8/2007 |

* cited by examiner

*Primary Examiner* — Ishrat I Sherali
(74) *Attorney, Agent, or Firm* — Oblon, Spivak, McClelland, Maier & Neustadt, L.L.P.

(57) ABSTRACT

An image processing apparatus includes: an intermediate code generating unit that, when a data string that matches an input data string of image data is found from data string of the image data input in the past, outputs a length and a position of the found data string and, when a data string that matches with the input data string is not found, outputs the input data string as escape data; and an encoding unit that performs encoding with the length of the found data string, the position of the found data string, and the escape data. When a plurality of the escape data are successively output from the intermediate code generating unit, the encoding unit encodes the plurality of escape data collectively by adding, to the plurality of the escape data, information representing a count value obtained by counting a number of the plurality of the escape data.

5 Claims, 19 Drawing Sheets

IMAGE PROCESSING APPARATUS AND IMAGE PROCESSING METHOD

CROSS-REFERENCE TO RELATED APPLICATIONS

The present application claims priority to and incorporates by reference the entire contents of Japanese Patent Application No. 2010-112575 filed in Japan on May 14, 2010.

BACKGROUND OF THE INVENTION

1. Field of the Invention

The present invention relates to an image processing apparatus and an image processing method of performing compression coding on image data.

2. Description of the Related Art

An image forming apparatus such as a printer apparatus temporarily stores image data. In this case, if image data is stored without any change, a high-capacity memory is required, resulting in an increase in cost. In order to solve this problem, image data is compressed and is then stored in a memory.

For example, a print process of the printer apparatus is performed as follows. The printer apparatus receives a page description language (PDL), which is created by, for example, a computer, through a network and analyzes the PDL to generate an intermediate language that can be executed by a rendering unit. The rendering unit analyzes the intermediate language and renders a gradation-processed image to a band memory. The rendered image data is compressed and encoded by a binary image compression coding algorithm, and the generated code data is stored in the memory. Thereafter, during a print operation, the code data is read from the memory in such a way that each of C, M, Y, and K plates is delayed from the preceding thereof, and the read code data is decoded. Then, the decoded data is transmitted to a printer engine corresponding to the data of each of C, M, Y, and K plates and then the printer engine performs printing.

As a technique of effectively compressing data, a technique of performing compression by universal coding has been put into practical use. The universal coding is a lossless data compression scheme and can be applied to various types of data (for example, a character code and an object code) since previous assumption of a statistical nature of an information source is not made when data compression is performed.

A representative universal coding scheme includes Ziv-Lempel coding. For the Ziv-Lempel coding, two algorithms—a universal type and an incremental parsing type—have been suggested. Of these, as a practical scheme using the universal type algorithm, there is Lempel-Ziv-Storer-Syzmanski (LZSS) coding. Meanwhile, as a practical scheme using the incremental parsing type algorithm, there is Lempel-Ziv-Welch coding.

A coding algorithm of LZ77 coding, which is the basis of the LZSS coding, divides coding data into strings of a maximum length each matching a part of a past data string extracted from an arbitrary position thereof and encodes the strings as a duplication of the past data string.

In further detail, it provides a moving window that stores therein already-encoded input data and a look-ahead buffer that stores therein data to be subsequently encoded. All partial strings extracted from a data string in the look-ahead buffer is compared with all partial strings extracted from a data string in the moving window, to obtain a matching partial string with a maximum length between the moving window and the look-ahead buffer. In order to designate the partial string with the maximum length in the moving window, encoding is made with a set of "a start position" and "a matching length" of the partial string with the maximum length and "a next symbol that causes non-matching.". Next, the encoded data string in the look-ahead buffer is moved to the moving window, and a new data string, length of which corresponds to that of the encoded data string, is input to the look-ahead buffer. Thereafter, the same processing is repeated, so that data is decomposed into partial data strings to be encoded.

Generally, the LZSS coding requires detection to be repeated by a number of times depending on a length of the already-encoded input data in the moving window to obtain longest matching data string between an input data string and the already-encoded input data. Accordingly, the LZSS coding is considered to incur high computational cost but to exhibit high compression rate.

Meanwhile, a coding algorithm of the LZW coding builds a rewritable dictionary. An input character string is parsed into different character strings. The parsed character strings are, in order of arrival, assigned with a number and registered to the dictionary. Then, a currently input character string is represented only by the number assigned to a longest matching character string registered in the dictionary. As compared with the LZSS coding, the LZW coding is lower in compression rate, but is simpler, easier in computation, and can be processed at high speed. For this reason, the LZW coding is widely used for file compression in a storage apparatus, data transmission, etc.

Japanese Patent No. 3240495 discloses a coding technique of judging whether or not multi-byte data can be compression-encoded by the LZ scheme, performing compression encoding on the multi-byte data by LZ scheme when possible, and adding a small-size header to the multi-byte data when compression coding by the LZ scheme is impossible.

In the printer apparatus, in the printing, image data stored in the memory after having been subjected to compression encoding is read from the memory, and is then decoded before it is transmitted to the printer engine. For this reason, a decoding process of the compression-encoded image data needs to keep pace with the printing speed of the printer engine. Thus, for a compression coding scheme applied to the printer apparatus, it is required that a worst compression rate can be explicitly obtained and the amount of codes generated when image data is compressed and encoded at a worst compression rate needs be as small as possible.

Here, there may be a case in which the amount of codes generated at the worst compression rate is much larger than the amount of data of original image data. In this case, it is necessary to check for whether or not a memory access time during decoding an amount of codes obtained through encoding at the worst compression rate is sufficient with respect to the speed of transmitting the decoded image data to the printer engine and whether or not the capacity of the memory is sufficient to store data of an amount of codes obtained through encoding at the worst compression rate. For example, in a complicated compression coding scheme using a discrete cosine transform (DCT) such as Joint Photographic Experts group (JPEG), there is a problem in that it is difficult to obtain the worst compression rate and so it is not easy to design a system.

Meanwhile, it has been known that the LZ77 coding can be applied to photographic image data having a high resolution or photographic image data interpolated by, for example, a bilinear technique. Further, in the LZ77 coding, when encoding cannot be performed in units of one byte, since encoding is performed by adding a header to raw data of one byte, it is possible to easily obtain the worst compression rate for the case in which encoding in units of one bye is not performed at all. However, in this case, since the header is added to every unit of raw data that cannot be encoded in units of one byte, there is a problem in that the encoded data size becomes larger than the data size of original raw data.

According to the technique disclosed in Japanese Patent No. 3240495, when the compression coding cannot be performed by the LZ coding, encoding is performed by adding a header at a head of multi-byte data. Accordingly, it is advantageous, in improving the compression rate, over the case in which the header is added to each unit of raw data (one byte). However, the technique is also problematic in that the maximum matching length in the compression decoding is limited to that of initially judged multi-byte data or below, which leads to deterioration of the compression rate.

Further, in the technique of Japanese Patent No. 3240495, it may be considered to further increase the maximum matching length in order to improve the compression rate. Such a case is problematic in that it is necessary to increase the size of a buffer that temporarily stores data to be encoded, and thus the memory capacity increases.

For example, in an LHZ scheme that is also one scheme included in the LZ scheme, the maximum matching length is 8 kilo bytes, and in a ZIP scheme, the maximum matching length is 32 kilo bytes. Thus, in order to improve the compression rate, it is necessary to use a buffer of 8 kilo bytes and a buffer of 32 kilo bytes in the LHZ scheme and the ZIP scheme, respectively.

Further, in Japanese Patent No. 3240495, when compression coding is performed by a two-path method including: a judgment process on whether or not encoding per one byte unit can be performed; and an encoding process based on the LZ scheme, in order to increase the process speed, it is necessary to use the buffer of 8 kilo bytes or 32 kilo bytes for each of the judgment process and the encoding process, and thus the memory capacity further increases. Further, in the case of performing a pipeline process, it is necessary to additionally use a toggle buffer and further increase the memory capacity.

SUMMARY OF THE INVENTION

It is an object of the present invention to at least partially solve the problems in the conventional technology.

According to an aspect of the present invention, there is provided an image processing apparatus, including: a search unit that searches for a data string that matches an input data string that is image data consecutively input, from data string of the image data input in the past; an intermediate code generating unit that, when a data string that matches the input data string is found by the search unit, outputs a length of the found data string and a position of the found data string on the data string input in the past and, when a data string that matches with the input data string is not found, outputs the input data string as escape data; a count unit that counts a number of successive outputs of the escape data from the intermediate code generating unit; and an encoding unit that performs encoding with the length of the found data string, the position of the found data string on the data string input in the past, and the escape data. When a plurality of the escape data are successively output from the intermediate code generating unit, the encoding unit encodes the plurality of escape data collectively by adding, to the plurality of the escape data, information representing a count value obtained by counting a number of the plurality of the escape data through the count unit.

According to another aspect of the present invention, there is provided an image processing method, including: searching for, by a search unit, a data string that matches an input data string which is image data consecutively input, from data string of the image data input in the past; generating, by an intermediate code generating unit, an intermediate code in such a manner that, when a data string that matches the input data string is found, the intermediate code generating unit outputs a length of the found data string and a position of the found data string on the data string input in the past and, when a data string that matches the input data string is not found, the intermediate code generating unit outputs the input data string as escape data; counting, by a count unit, a number of successive outputs of the escape data from the intermediate code generating unit; and performing encoding, by an encoding unit, with the length of the found data string, the position of the found data string on the data string input in the past, and the escape data. When a plurality of the escape data are consecutively output by the generating the intermediate code, the plurality of the escape data are encoded collectively by adding, to the plurality of the escape data, information representing a count value obtained by counting a number of the plurality of the escape data through the count unit.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter, exemplary embodiments of an image processing apparatus according to the present invention will be described with the reference to the accompanying drawings. In the present invention, in compression coding of image data by an LZ scheme, when escape data (hereinafter, ESC data), which is code data generated, when a data string that longest-matches an input data string is not found in a dictionary, by using the input data string as the code data "as is", is successively repeated, a header is added to consecutive ESC data collectively. Since one header is added to a plurality of ESC data, it is expected that the compression rate improves when ESC data is successively repeated.

Common Configuration of Embodiments

Figure 1:
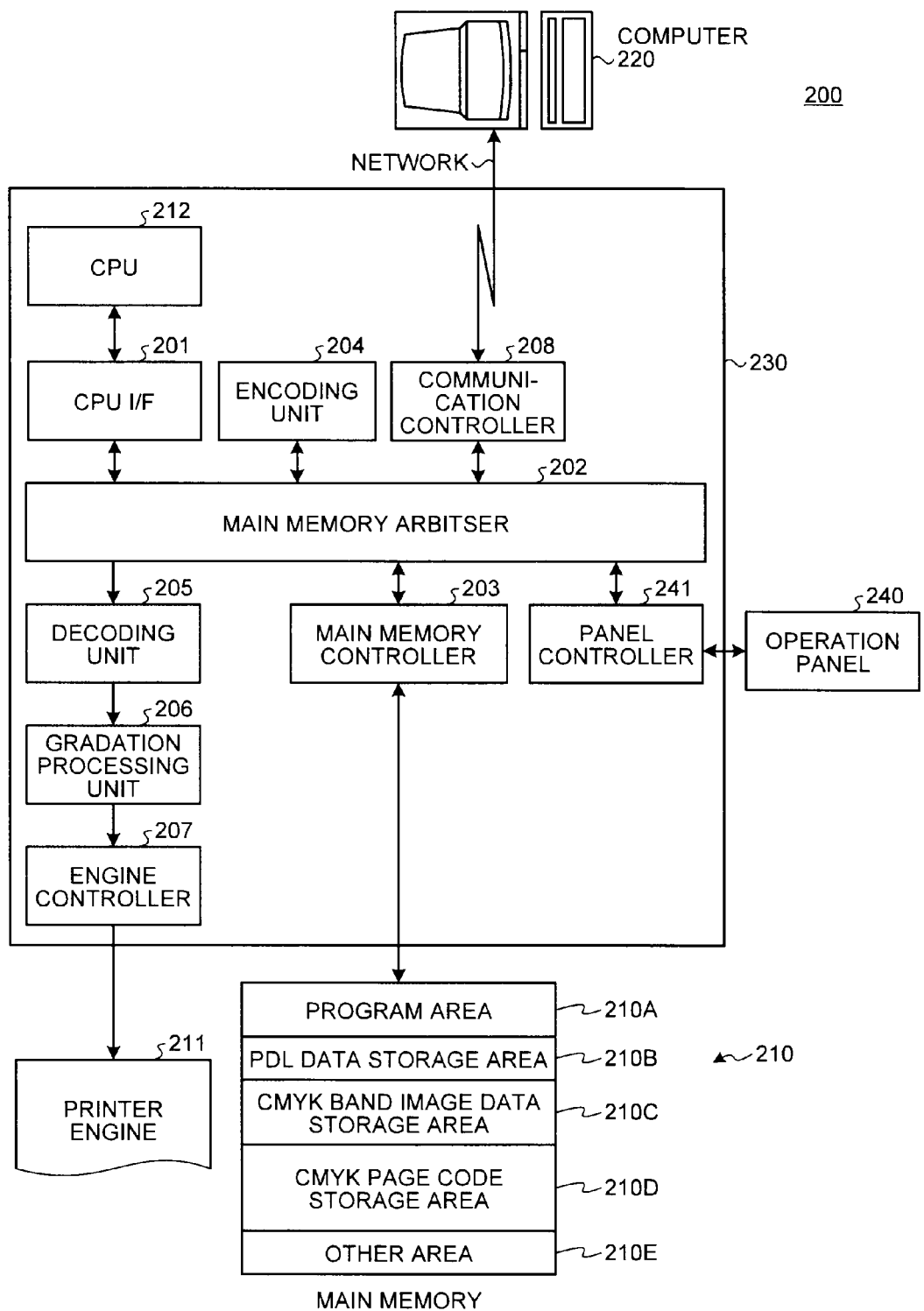
FIG. 1 is a block diagram illustrating an exemplary configuration of a printer apparatus to which an image processing apparatus according to the present invention can be applied.

FIG. 1 illustrates an exemplary configuration of a printer apparatus 200 to which an image processing apparatus according to the present invention can be applied. In the example of FIG. 1, the printer apparatus 200 includes a control unit 230, a main memory 210, a printer engine 211, and an operation panel 240. The control unit 230 includes a central processing unit (CPU) 212, a CPU I/F 201, a main memory arbiter 202, a main memory controller 203, an encoding unit 204, a decoding unit 205, a gradation processing unit 206, an engine controller 207, and a panel controller 241.

The CPU 212 controls an overall operation of the printer apparatus 200 according to a program stored in the main memory 210. The CPU 212 is connected to the main memory arbiter 202 via the CPU I/F 201. The main memory arbiter 202 arbitrates access of the CPU 212, the encoding unit 204, the decoding unit 205, and a communication controller 208 to the main memory 210.

The main memory 210 is connected to the main memory arbiter 202 via the main memory controller 203. The main memory controller 203 controls access to the main memory 210.

The main memory 210 has a program area 210A, a PDL data storage area 210B, a CMYK band image data storage area 210C, a CMYK page code storage area 210D, and the other area 210E. A program that causes the CPU 212 to operate is stored in the program area 210A. PDL data supplied from, for example, a computer 220 through the communication controller 208 is stored in the PDL data storage area 210B. CMYK band image data is stored in the CMYK band image data storage area 210C. Code data obtained by performing compression encoding on the CMYK band image data is stored in the CMYK page code storage area 210D. In the CMYK page code storage area 210D, code data generated by compression-encoding an amount of the CMYK band image data corresponding to, for example, one page. Data that is not described before is stored in the other area 210E.

The encoding unit 204 encodes band image data stored in the main memory 210. Code data obtained by encoding the band image data is supplied to the main memory 210 through the main memory arbiter 202 and the main memory controller 203, and is then written in the CMYK page code storage area 210D. The decoding unit 205 reads out and decodes the code data from the CMYK page code storage area 210D of the main memory 210 in synchronization with the printer engine 211 which will be described later. The decoded image data is supplied to the gradation processing unit 206 to be subjected to a gradation process and is then transmitted to the engine controller 207.

The engine controller 207 controls the printer engine 211. FIG. 1 illustrates only one printer engine 211 for one plate of C, M, Y, and K color plates, and does not illustrate the other printer engines for the other plates for simplicity in illustration.

The communication controller 208 controls communication through the network. For example, the communication controller 208 receives PDL data from the computer 220 through the network. The communication controller 208 transmits the received PDL data to the main memory 210 through the main memory arbiter 202 and the main memory controller 203.

The network may be, for example, one such as a Local Area Network (LAN) in which communication is performed within a predetermined range or one such as the Internet in which communication can be performed in a broader range. The network is not limited to a wire communication network but may include a wireless communication network. Further, the network may include a serial communication network such as universal serial bus (USB) or institute electrical and electronics engineers (IEEE) 1394.

The operation panel 240 includes a plurality of operation elements used to receive a user's operation and a display device used to provide the user with information. The panel controller 241 controls display on the operation panel 240 according to an instruction from the CPU 212 and transmits a signal according to the user's operation that has been made on the operation panel 240 to the CPU 212.

Figure 2:
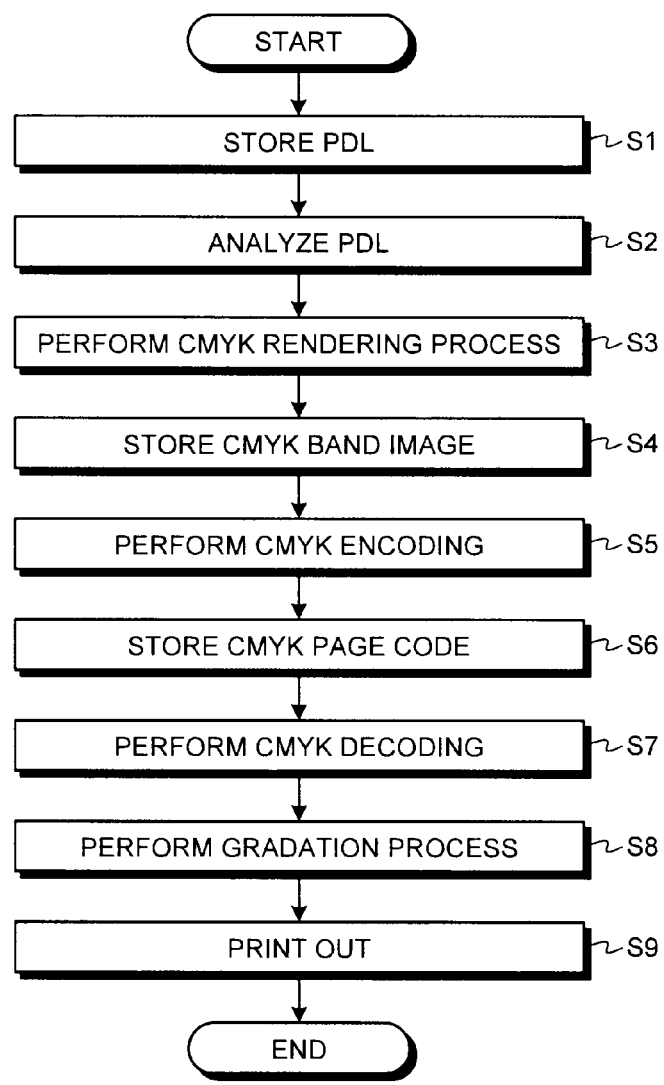
FIG. 2 is a flowchart schematically illustrating an example of an overall operation of a printer apparatus.
Figure 3:
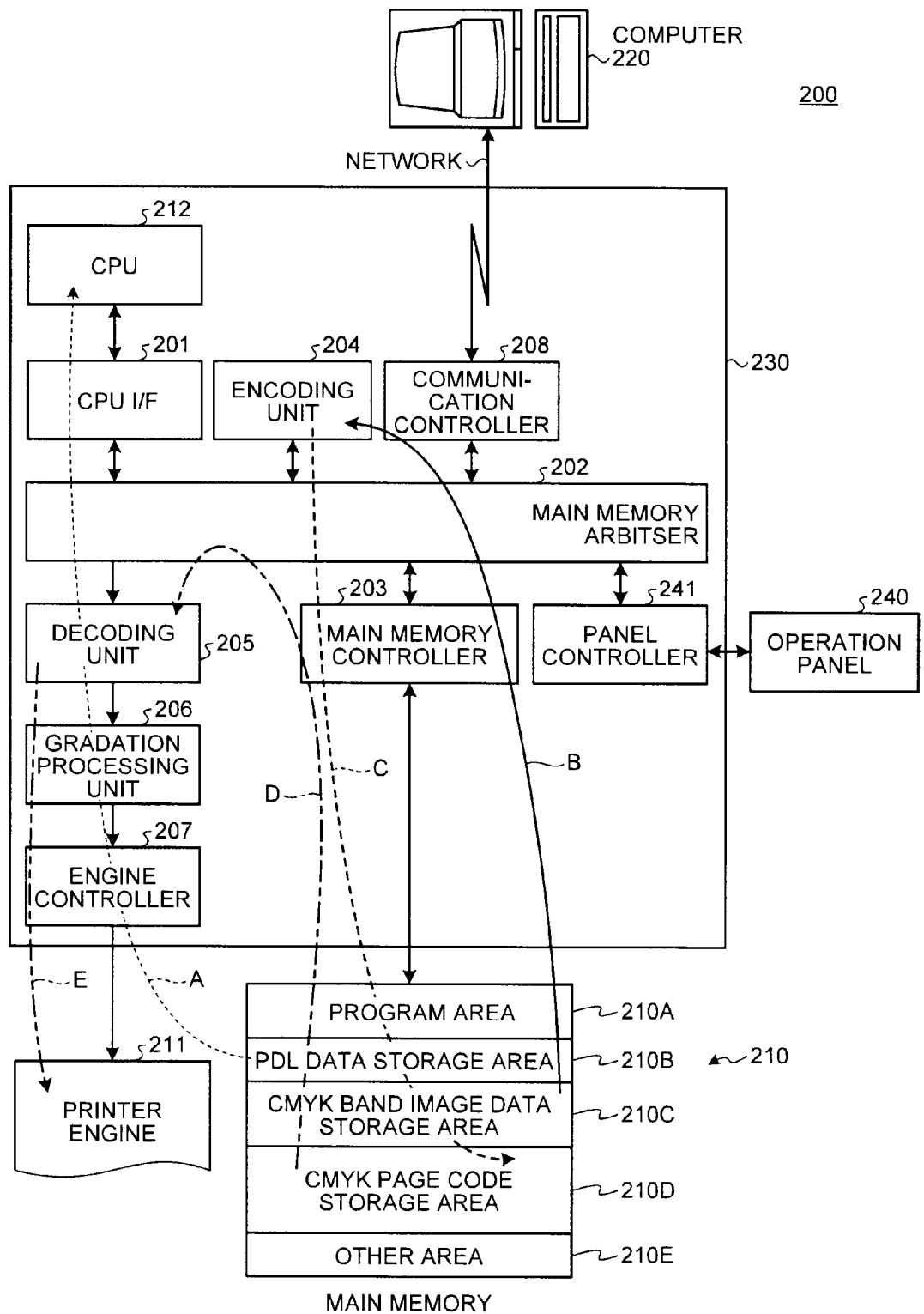
FIG. 3 is a schematic diagram illustrating the flow of data inside a printer apparatus in an overall operation of the printer apparatus.

An example of an overall operation of the printer apparatus 200 will be described with reference to FIGS. 2 and 3. FIG. 2 is a flowchart schematically illustrating an example of an overall operation of the printer apparatus 200. FIG. 3 illustrates the flow of data inside the printer apparatus 200 in the operation according to the flowchart of FIG. 2 (paths A to E).

For example, PDL data generated at the computer 220 is received by the communication controller 208 via the network and is then stored in the PDL data storage area 210B of the main memory 210 (step S1). The CPU 212 reads out the PDL data from the PDL data storage area 210B of the main memory 210 according to a path A, analyzes the PDL data (step S2), and renders a CMYK band image based on the analysis result (step S3). CMYK band image data based on the rendered band image for CMYK is stored in the CMYK band image data storage area 210C of the main memory 210 (step S4).

The encoding unit 204 reads out the CMYK band image data from the CMYK band image data storage area 210C according to a path B and encodes the CMYK band image data using an encoding scheme according to embodiments of the present invention (step S5). Code data obtained by encoding the CMYK band image data is stored in the CMYK page code storage area 210D of the main memory 210 according to a path C (step S6).

The decoding unit 205 reads out the code data from the CMYK page code storage area 210D according to a path D, decodes the code data into image data (step S7), and supplies the gradation processing unit 206 with the decoded image data. The gradation processing unit 206 performs the gradation process on the image data supplied from the decoding unit 205 (step S8). The gradation-processed image data is supplied to the printer engine controller 207 according to a path E. The engine controller 207 controls the printer engine 211 to perform a print out process, based on the received image data (step S9).

Encoding Process According to First Embodiment

Figure 4:
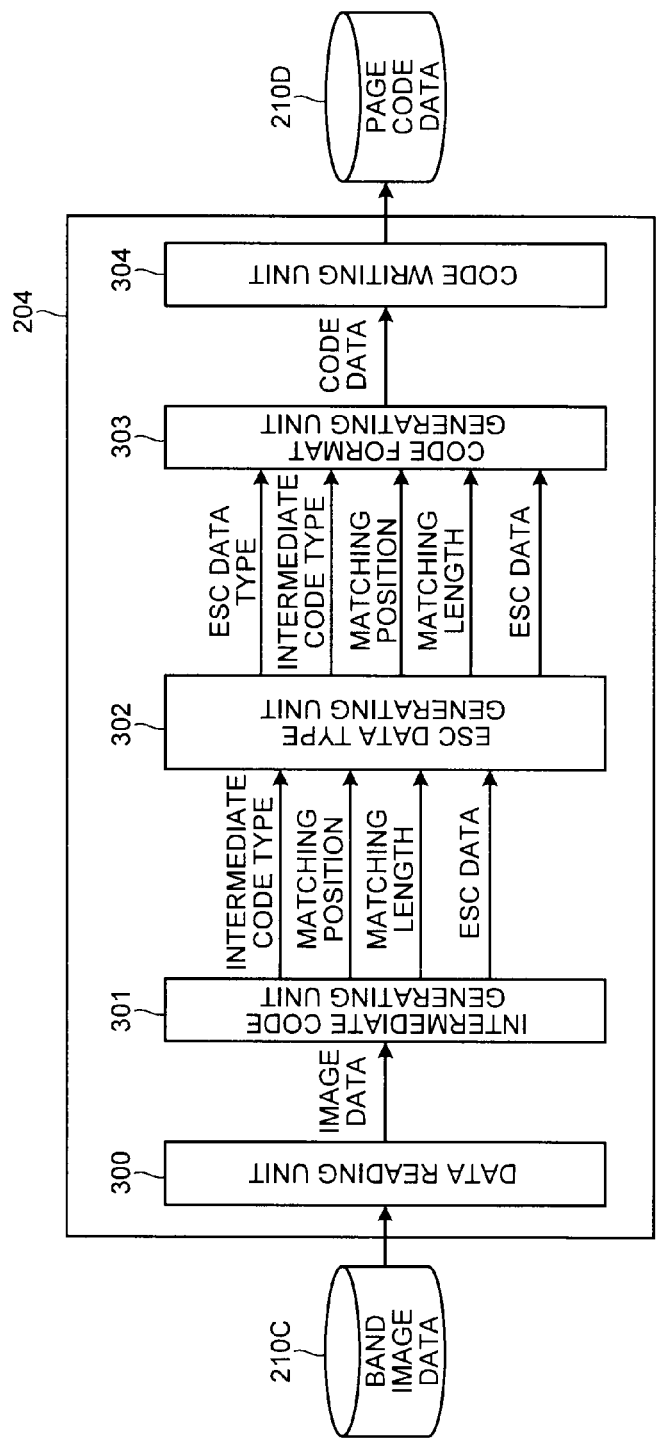
FIG. 4 is a block diagram illustrating an exemplary configuration of an encoding unit according a first embodiment.

FIG. 4 illustrates an exemplary configuration of the encoding unit 204 according to a first embodiment. The encoding unit 204 includes a data reading unit 300, an intermediate code generating unit 301, an ESC data TYPE generating unit 302, a code format generating unit 303, and a code writing unit 304.

In the encoding unit 204, the data reading unit 300 reads the CMYK band image data from the CMYK band image data storage area 210C of the main memory 210 through the main memory controller 203 and the main memory arbiter 202. The following description will be made in connection with band image data of C color among CMYK colors, and the band image data is referred to as simply "image data." The image data read by the data reading unit 300 is supplied to the intermediate code generating unit 301.

The intermediate code generating unit 301 includes a slide storage unit of a First In First Out (FIFO) type that sequentially stores input data. The intermediate code generating unit 301 sequentially compares the supplied image data with past input data stored in the slide storage unit and searches for a data string from the past input data that matches a data string from the supplied image data. When the data string from the past input data that matches the data string from the supplied image data is found, encoding is performed with a matching position Address representing a corresponding position in the slide storage unit of the past input data and a matching length Leng that is a value representing a corresponding matching length. When both do not match each other, encoding is performed with a data value itself by using it as the ESC data. The ESC data, the matching position Address, the matching length Leng, and an intermediate code TYPE representing whether or not the data string from the supplied data matches the data string from the past input data are output. In this example, it is assumed that the intermediate code generating unit 301 has 256 slides.

The values output from the intermediate code generating unit 301 are supplied to the ESC data TYPE generating unit 302. The ESC data TYPE generating unit 302 counts a number of successive repetitions of an intermediate code TYPE representing that the data string from the supplied data does not match the data string from the past input data (hereinafter, referred to as an intermediate code TYPE representing a mismatch) and generates an ESC data TYPE used to identify a number of successive repetitions of the ESC data. In the first embodiment, as the ESC data TYPE, three kinds, between which the number of successive repetitions of the ESC data takes discrete values, including ESC data (1) representing one ESC data, ESC data (4) representing that ESC data are successively repeated four times, and ESC data (8) representing that ESC data are successively repeated eight times are defined. By combining the three kinds of ESC data TYPEs, it is possible to express an arbitrary number of successive repetitions of the ESC data.

The ESC data TYPE generating unit 302 outputs the generated ESC data TYPE and also outputs the ESC data, the matching position Address, the matching length Leng, and the intermediate code TYPE which are supplied from the intermediate code generating unit 301. The values output from the ESC data TYPE generating unit 302 are supplied to the code format generating unit 303. The code format generating unit 303 performs encoding with the supplied ESC data, the matching position Address, the matching length Leng, the intermediate code TYPE, and the ESC data TYPE according to a format illustrated at (a) to (d) in FIG. 5.

Figure 5:
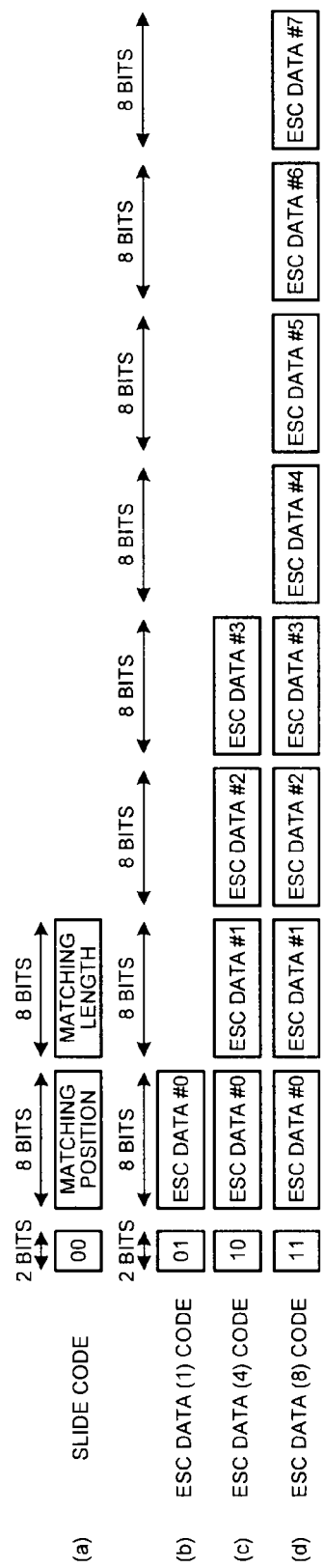
FIG. 5 is schematic diagram illustrating an example of a code format according to the first embodiment.

Codes illustrated at (a) to (d) in FIG. 5 are identified by a header of two bits at the front. In this example, when a header value is "00," it represents that data following the header is a slide code, and the matching position Address and the matching length Leng are connected to the header. In this example, since the number of slides in the intermediate code generating unit 301 is 256, the matching position Address and the matching length Leng have, for example, the data length of 8 bits, respectively.

When the header value is any one of "01," "10," and "11," the header represents the ESC data TYPE. At (b), (c), and (d) in FIG. 5, an example of an ESC data (1) code in which the ESC data is encoded according to the ESC data TYPE of the ESC data (1), an example of an ESC data (4) code in which the ESC data is encoded according to the ESC data TYPE of the ESC data (4), and an example of an ESC data (8) code in which the ESC data is encoded according to the ESC data TYPE of the ESC data (8) are shown, respectively. In the present first embodiment, by adding one header collectively to every predetermined number (a case in which this number is two or more is included) of ESC data, encoding of the ESC data is performed.

In further detail, when the header value is "01," it represents the ESC data (1) code, and ESC data #0 having the data length of 8 bits is connected to the header. When the header value is "10," it represents the ESC data (4) code, and 4 ESC data #0 to #3 each having the data length of 8 bits are connected to the header. Further, when the header value is "11," it represents the ESC data (8) code, and 8 ESC data #0 to #7 each having the data length of 8 bits are connected to the header.

In this way, by adding one header collectively to two or more predetermined number of consecutive ESC data, it is possible to reduce the number of headers and the code length. As an example, 7 consecutive ESC data can be expressed by 4 codes composed of 3 ESC data (1) codes and one ESC data (4) code. In this case, a total code amount of the 4 codes is 62 bits that is the sum of a data part (7×8 bits) and a header part (3×2 bits). An expansion rate of the code (a code amount/a data amount) is 1.10 times original data.

Meanwhile, 7 consecutive ESC data can be expressed by 7 ESC data (1) codes. In this case, a total code amount of the 4 codes is 70 bits that is the sum of a data part (7×8 bits) and a header part (7×2 bits). In this case, an expansion rate of a code is 1.25 times. Compared to the case in which 3 ESC data (1) codes and one ESC data (4) code are combined, the expansion rate of this case increases by an increment in the number of headers, and thus it is disadvantages. In this manner, by collectively using a plurality of ESC data to perform encoding, the expansion rate of the code amount can be reduced.

The code formats illustrated in FIG. 5 are one example, and the present invention is not limited thereto. For example, 3 ESC data TYPEs have been defined above: a type in which the number of successive repetitions of the ESC data is 1; a type in which the number of successive repetitions of the ESC data is 4; and a type in which the number of successive repetitions of the ESC data is 8. However, the ESC data TYPE is not limited to this combination, and another type in which the number of successive repetitions of the ESC is a different value may be used. Further, 2, 4, or more ESC data TYPEs may be defined. In the case in which 4 or more ESC data TYPEs are defined, the bit number of the header needs be 3 or more bits.

The slide code, the ESC data (1) code, the ESC data (4) code, and the ESC data (8) code generated by the code format generating unit 303 are supplied to the code writing unit 304. The code writing unit 304 writes the supplied codes in the CMYK page code storage area 210D of the main memory 210 through the main memory arbiter 202 and the main memory controller 203.

Figure 6:
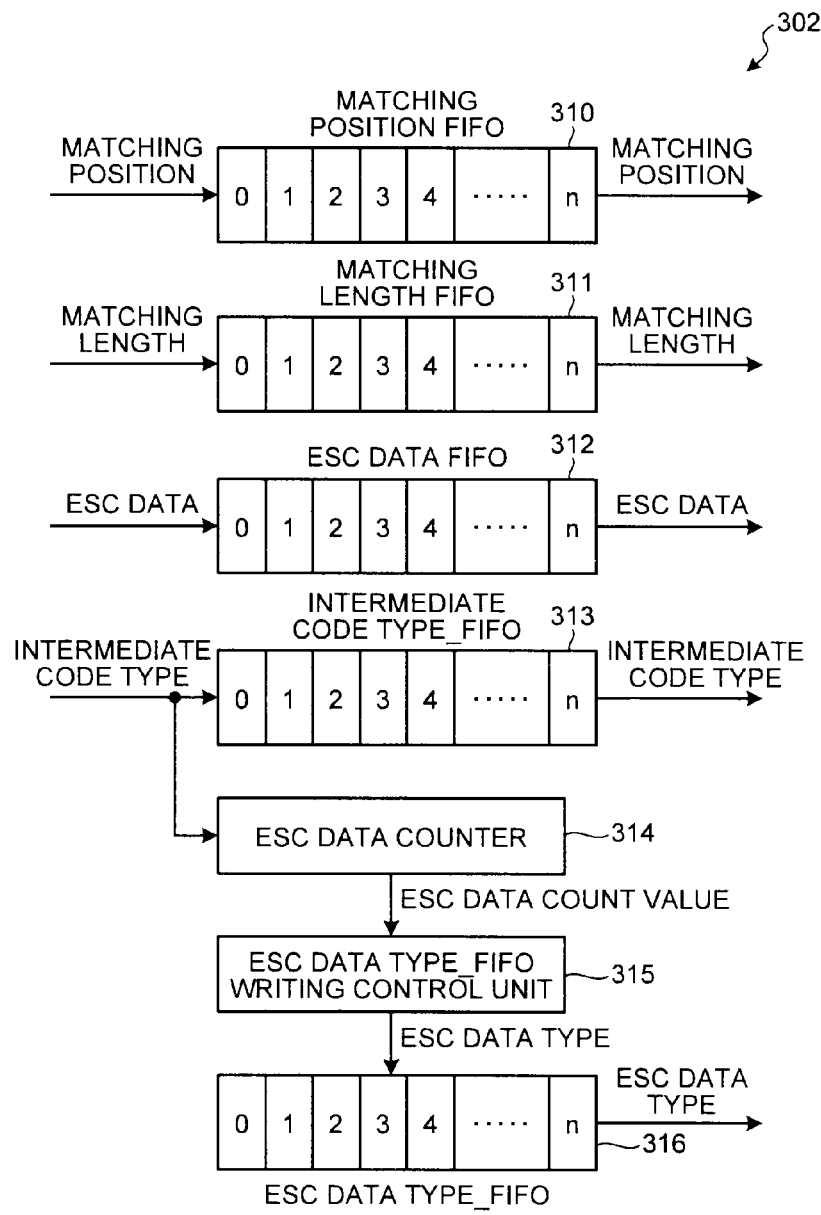
FIG. 6 is a block diagram illustrating an exemplary configuration of an ESC data TYPE generating unit.

FIG. 6 illustrates an exemplary configuration of the ESC data TYPE generating unit 302. The ESC data TYPE generating unit 302 includes a matching position FIFO 310, a matching length FIFO 311, an ESC data FIFO 312, an intermediate code TYPE_FIFO 313, and an ESC data TYPE_FIFO 316, which are buffer memories having a FIFO configuration. The ESC data TYPE generating unit 302 further includes an ESC data counter 314 that counts a number of successive repetitions of the intermediate code TYPE representing a mismatch and an ESC data TYPE_FIFO writing control unit 315. That is, the ESC data counter 314 counts a number of times the ESC data is successively repeated.

In the matching position FIFO 310 and the matching length FIFO 311, the matching position Address and the matching length Leng are written, respectively, and writing and outputting of data are performed in units of 8 bits. In the ESC data FIFO 312, the ESC data is written, and writing and outputting of data are performed in units of 8 bits. In the intermediate code TYPE_FIFO 313, the intermediate code TYPE is written, and writing and outputting of data are performed in units of an intermediate code TYPE (for example, 8 bits).

In the ESC data TYPE_FIFO 316, the ESC data TYPE is written, and writing and outputting of data are performed in units of an ESC data TYPE (for example, 8 bits). The ESC data TYPE_FIFO 316 is controlled by the ESC data TYPE_FIFO writing control unit 315 so that writing and reading is performed in synchronization with the matching position FIFO 310, the matching length FIFO 311, the ESC data FIFO 312, and the intermediate code TYPE_FIFO 313. That is, the ESC data TYPE_FIFO writing control unit 315 controls the ESC data TYPE_FIFO 316 so that writing and reading is performed in synchronization with an output of the intermediate code generating unit 301.

The ESC data counter 314 counts the number of successive repetitions of the ESC data based on the value of the intermediate code TYPE and transmits an ESC data count value, which is obtained by counting the number of successive repetitions of the ESC data, to the ESC data TYPE_FIFO writing control unit 315 when consecution of the ESC data is disrupted.

The ESC data TYPE_FIFO writing control unit 315 analyzes the ESC data count value transmitted from the ESC data counter 314 and generates the ESC data TYPE. A value representing the generated ESC data TYPE is written at the position, depending on the ESC data TYPE, in the ESC data TYPE_FIFO 316. At this time, as will be described later, the ESC data TYPE_FIFO writing control unit 315 writes the value representing the ESC data TYPE at the position, depending on the ESC data TYPE, in the ESC data TYPE_FIFO 316.

Figure 7:
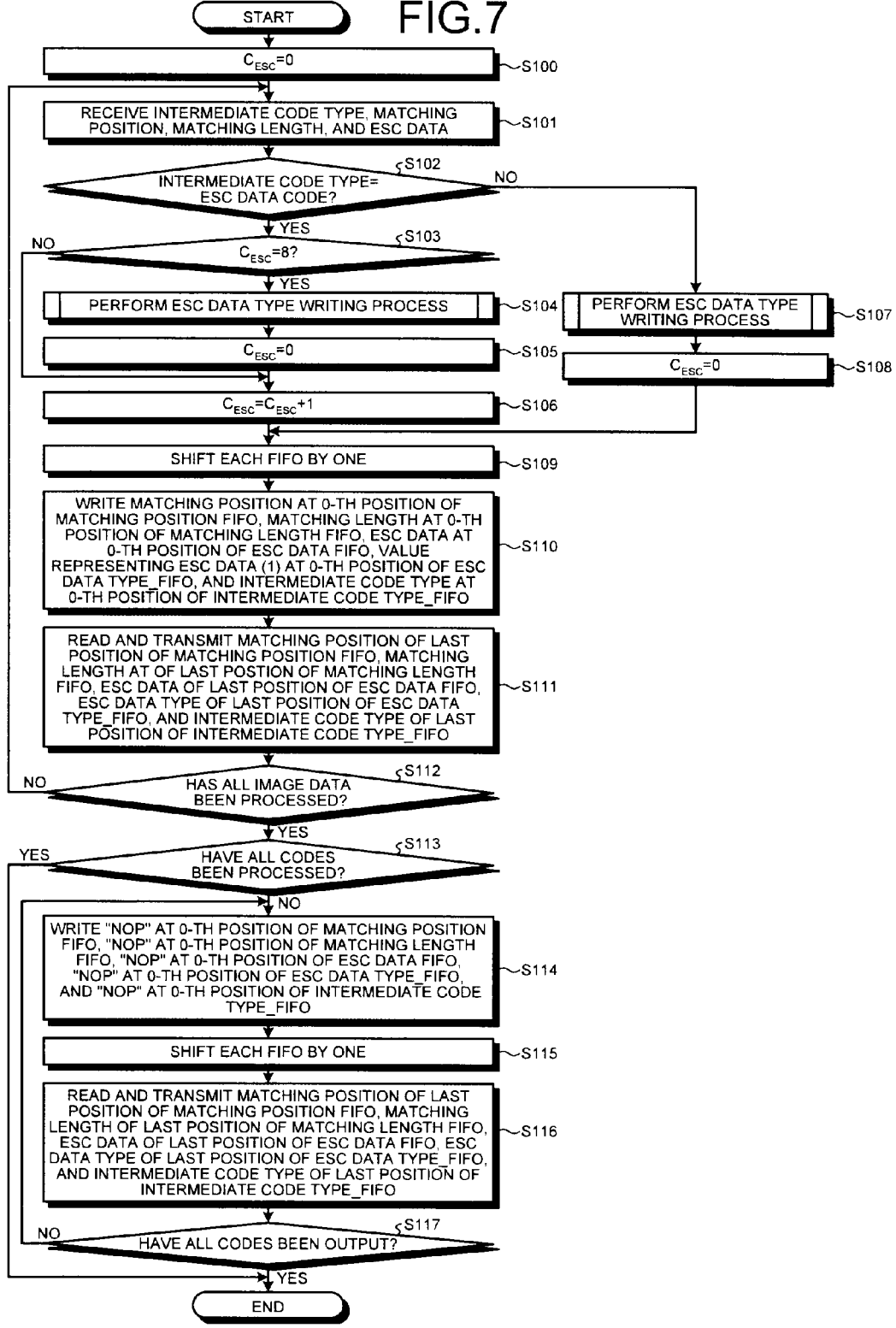
FIG. 7 is a flowchart illustrating an example of an ESC data TYPE generation process.

FIG. 7 is a flowchart illustrating an example of an ESC data TYPE generation process in the ESC data TYPE generating unit 302. In first step S100, the ESC data count value $C_{ESC}$ in the ESC data counter 314 is initialized to zero (0).

In step S101, the ESC data TYPE generating unit 302 receives the intermediate code TYPE, the matching position Address, the matching length Leng, and the ESC data from the intermediate code generating unit 301. In next step S102, the ESC data TYPE generating unit 302 judges whether or not the received intermediate code TYPE represents the ESC data code. When it is judged that the received intermediate code TYPE represents the ESC data code, the process proceeds to step S103, and it is judged whether or not the ESC data count value $C_{ESC}$ is 8.

When it is judged in step S103 that the ESC data count value $C_{ESC}$ is not 8, the process proceeds to step S106, and the ESC data count value $C_{ESC}$ is increased by one.

However, when it is judged in step S103 that the ESC data count value $C_{ESC}$ is 8, the process proceeds to step S104. In step S104, the ESC data TYPE_FIFO writing control unit 315 performs the writing process of the ESC data TYPE on the ESC data TYPE_FIFO 316.

Figure 8:
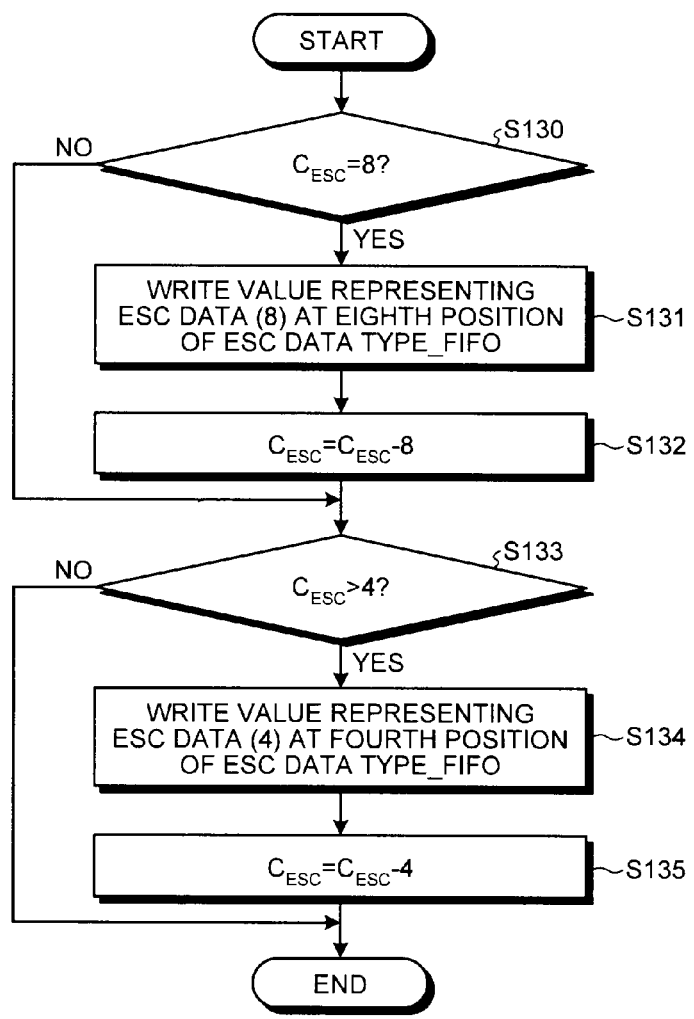
FIG. 8 is a flowchart illustrating an ESC data TYPE writing process in further detail.

FIG. 8 is a flowchart illustrating the ESC data TYPE writing process in step S104 and step S107, which will be described later, in further detail. Each process according to the flowchart of FIG. 8 is performed by the ESC data TYPE_FIFO writing control unit 315. First, in step S130, it is judged whether or not the ESC data count value $C_{ESC}$ is 8. When it is judged that the ESC data count value $C_{ESC}$ is not 8, the process proceeds to step S133.

However, when it is judged that the ESC data count value $C_{ESC}$ is 8, the process proceeds to step S131. In step S131, the ESC data TYPE_FIFO writing control unit 315 writes a value representing the ESC data (8) at the eighth position in the ESC data TYPE_FIFO 316 when counted starting from an input side. Next, in step S132, 8 is subtracted from the ESC data count value $C_{ESC}$ to obtain a new ESC data count value $C_{ESC}$. Then, the process proceeds to step S133.

In step S133, the ESC data TYPE_FIFO writing control unit 315 judges whether or not the ESC data count value $C_{ESC}$ is a value larger than 4. When it is judged that the ESC data count value $C_{ESC}$ is a value equal to or less than 4, a series of processes in FIG. 8 is finished, and the process proceeds to the process in the flowchart of FIG. 7.

Meanwhile, when it is judged that the ESC data count value $C_{ESC}$ is a value larger than 4, the process proceeds to step S134. In step S134, the ESC data TYPE_FIFO writing control unit 315 writes a value representing the ESC data (4) at the fourth position in the ESC data TYPE_FIFO 316 when counted starting from the input side. Next, in step S135, 4 is subtracted from the ESC data count value $C_{ESC}$ to obtain a new ESC data count value $C_{ESC}$. Then, a series of processes in FIG. 8 is finished, and the process proceeds to the process of the flowchart of FIG. 7.

Returning back to the flowchart of FIG. 7, when the writing process of the ESC data TYPE is performed in step S104, the process proceeds to step S105. In step S105, the ESC data count value $C_{ESC}$ is reset to zero. Next, in step S106, the ESC data count value $C_{ESC}$ increases by one, and the process proceeds to step S109.

Meanwhile, when it is judged in step S102 that the intermediate code TYPE does not represent the ESC data code, the process proceeds to step S107, and, in a manner as described above with reference to FIG. 8, the writing process of the ESC data TYPE is performed. Next, in step S108, the ESC data count value $C_{ESC}$ is reset to zero, and the process proceeds to step S109.

In step S109, the ESC data TYPE generating unit 302 shifts the matching position FIFO 310, the matching length FIFO 311, the ESC data FIFO 312, the intermediate code TYPE_FIFO 313, and the ESC data TYPE_FIFO 316 by one (one unit), respectively.

Next, in step S110, the ESC data TYPE generating unit 302 stores the data supplied from the intermediate code generating unit 301 in the FIFOs, respectively. That is, the ESC data TYPE generating unit 302 writes the matching position Address at the front (0-th position) in the matching position FIFO 310 and writes the matching length Leng at the 0-th position in the matching length FIFO 311. Further, the ESC data TYPE generating unit 302 writes the ESC data at the 0-th position in the ESC data FIFO 312 and writes the intermediate code TYPE at the 0-th position in the intermediate code TYPE_FIFO 313. Further, in the ESC data TYPE generating unit 302, the ESC data TYPE_FIFO writing control unit 315 writes the ESC data TYPE representing the ESC data (1) at the 0-th position in the ESC data TYPE_FIFO 316.

Next, in step S111, the ESC data TYPE generating unit 302 reads the data stored at the end (the last position) in each of the FIFOs and transmits the read data to the code format generating unit 303. That is, the ESC data TYPE generating unit 302 reads the matching position Address from the last position in the matching position FIFO 310 and the matching length Leng from the last position in the matching length FIFO 311, respectively, and transmits the matching position Address and the matching length Leng to the code format generating unit 303. Further, the ESC data TYPE generating unit 302 reads the ESC data from the last position in the ESC data FIFO 312 and the intermediate code TYPE from the last position in the intermediate code TYPE_FIFO 313, respectively, and transmits the ESC data and the intermediate code TYPE to the code format generating unit 303. Further, the ESC data TYPE generating unit 302 reads the ESC data TYPE from the last position in the ESC data TYPE_FIFO 316 and transmits the ESC data TYPE to the code format generating unit 303.

Next, in step S112, it is judged whether or not all image data to be processed has been processed. When it is judged that the image data that has not been processed is present, the process returns to step S101. However, when it is judged that all image data to be processed has been processed, the process proceeds to step S113, and it is judged whether or not all of the codes inside the FIFOs including the matching position FIFO 310, the matching length FIFO 311, the ESC data FIFO 312, the intermediate code TYPE_FIFO 313, and the ESC data TYPE_FIFO 316 have been output. When it is judged that all of the codes have been output, a series of processes according to the flowchart of FIG. 7 is finished.

However, when it is judged that the code that has not been output is present, the process proceeds to step S114. In step S114, the ESC data TYPE generating unit 302 writes a value representing no operation (NOP) at the front (the 0-th position) in each of the matching position FIFO 310, the matching length FIFO 311, the ESC data FIFO 312, and the intermediate code TYPE_FIFO 313. Further, the ESC data TYPE_FIFO writing control unit 315 writes a value representing NOP at the 0-th position in the ESC data TYPE_FIFO 316.

When the value representing NOP is written at the 0-th position in each of the FIFOs, in step S115, the ESC data TYPE generating unit 302 shifts the matching position FIFO 310, the matching length FIFO 311, the ESC data FIFO 312, the intermediate code TYPE_FIFO 313, and the ESC data TYPE_FIFO 316 by one (one unit), respectively.

In next step S116, the ESC data TYPE generating unit 302 reads the matching position Address from the last position in the matching position FIFO 310, the matching length Leng from the last position in the matching length FIFO 311, the ESC data from the last position in the ESC data FIFO 312, the intermediate code TYPE from the last position in the intermediate code TYPE_FIFO 313, and the ESC data TYPE from the last position in the ESC data TYPE_FIFO 316, respectively. Further, the ESC data TYPE generating unit 302 transmits the matching position Address, the matching length Leng, the ESC data, the intermediate code TYPE, and the ESC data TYPE to the code format generating unit 303.

In step S117, it is judged whether or not all of the codes inside the FIFOs including the matching position FIFO 310, the matching length FIFO 311, the ESC data FIFO 312, the intermediate code TYPE_FIFO 313, and the ESC data TYPE_FIFO 316 have been output. When it is judged that all of the codes have been output, a series of processes according to the flowchart of FIG. 7 is finished. However, when it is judged that the codes inside the FIFOs have not been completely output yet, the process returns to step S114.

Figure 9:
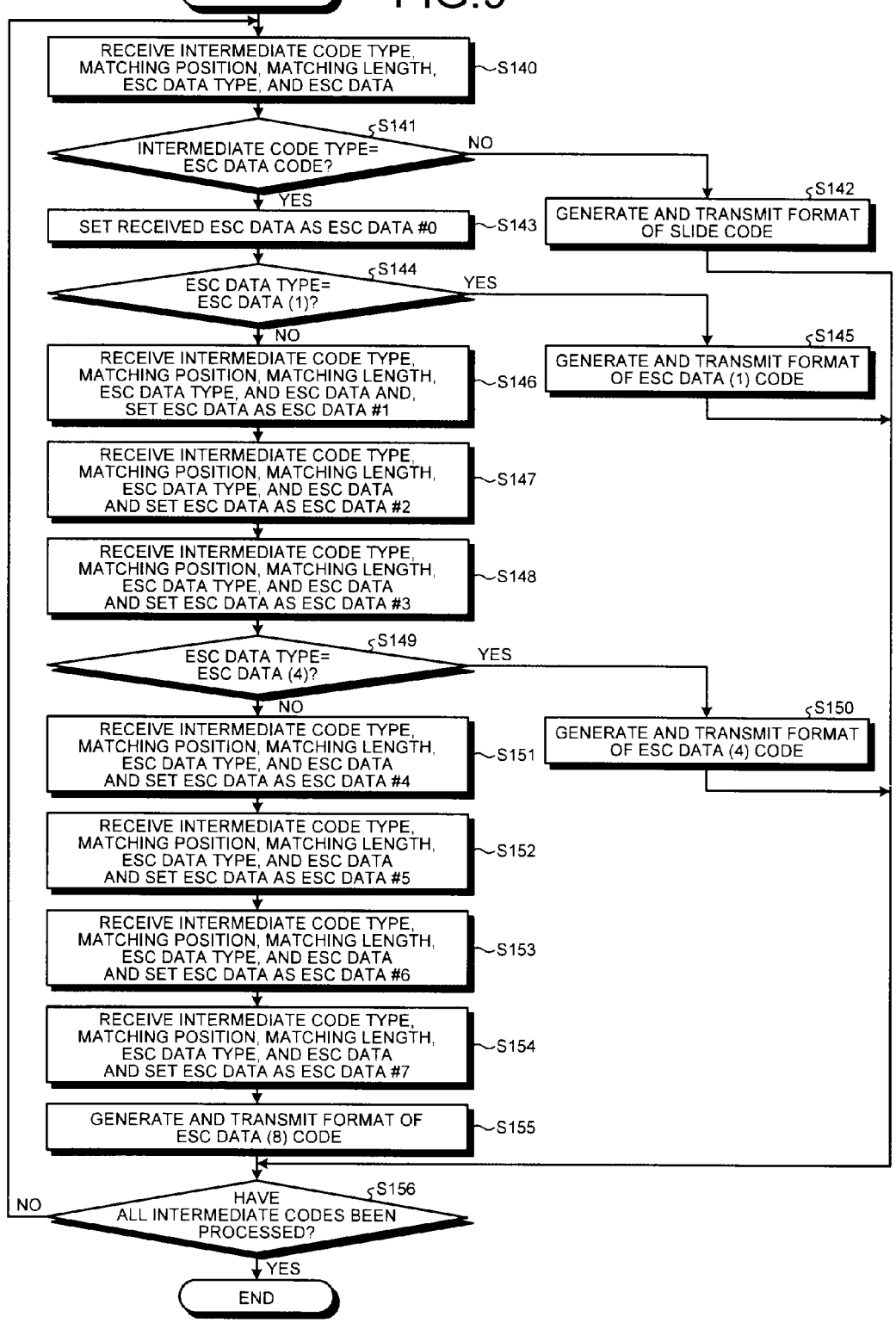
FIG. 9 is a flowchart illustrating an example of a code format generation process according to the first embodiment.

FIG. 9 is a flowchart illustrating an example of a code format generation process in the code format generating unit 303. First, in step S140, the code format generating unit 303 receives the ESC data TYPE, the intermediate code TYPE, the matching position Address, the matching length Leng, and the ESC data from the ESC data TYPE generating unit 302. In next step S141, it is judged whether or not the received intermediate code TYPE represents the ESC data code.

When it is judged in step S141 that the received intermediate code TYPE does not represent the ESC data code, the process proceeds to step S142. In step S142, the header value is set to "00," and code data is generated, according to the code format of the slide code illustrated in FIG. 5A, based on the matching position Address and the matching length Leng. The code format generating unit 303 transmits the generated code data to the code writing unit 304, and the process proceeds to step S156.

Meanwhile, when it is judged in step S141 that the received intermediate code TYPE represents the ESC data code, the process proceeds to step S143. In step S143, the code format generating unit 303 sets the ESC data received from the ESC data TYPE generating unit 302 in step S140 as first ESC data, that is, ESC data #0, and the process proceeds to step S144.

In step S144, the code format generating unit 303 judges whether or not the ESC data TYPE represents the ESC data (1) code. When it is judged that the ESC data TYPE represents the ESC data (1) code, the process proceeds to step S145, and code data is generated according to the code format of the ESC data (1) code illustrated at (b) in FIG. 5. In further detail, the ESC data (1) code is generated by setting the header value to "01" and connecting the ESC data received in step S140 to the header. Then, the process proceeds to step S156.

Meanwhile, when it is judged in step S144 that the ESC data TYPE does not represent the ESC data (1) code, the process proceeds to step S146. In step S146, the code format generating unit 303 receives the ESC data TYPE, the intermediate code TYPE, the matching position Address, the matching length Leng, and the ESC data that are output from the ESC data TYPE generating unit 302 in step S111 or step S116 in the flowchart of FIG. 7. The code format generating unit 303 sets the received ESC data as second ESC data, that is, ESC data #1, and the process proceeds to step S147.

In step S147, similarly, the code format generating unit 303 receives the ESC data TYPE, the intermediate code TYPE, the matching position Address, the matching length Leng, and the ESC data that are next output from the ESC data TYPE generating unit 302 in step S111 or step S116 in the flowchart of FIG. 7. The code format generating unit 303 sets the received ESC data as ESC data #2, and the process proceeds to step S148.

In step S148, similarly, the code format generating unit 303 receives the ESC data TYPE, the intermediate code TYPE, the matching position Address, the matching length Leng, and the ESC data that are next output from the ESC data TYPE generating unit 302 in step S111 or step S116 in the flowchart of FIG. 7. The code format generating unit 303 sets the received ESC data as ESC data #3, and the process proceeds to step S149.

In step S149, the code format generating unit 303 judges whether or not the ESC data TYPE received in step S147 represents the ESC data (4) code. When it is judged that the ESC data TYPE represents the ESC data (4) code, the process proceeds to step S150, and code data is generated according to the code format of the ESC data (4) code illustrated at (c) in FIG. 5. In further detail, the ESC data (4) code is generated by setting the header value to "10" and sequentially connecting the 4 ESC data received in step S140 and step S146 to step S148 to the header. Then, the process proceeds to step S156.

Meanwhile, when it is judged in step S149 that the ESC data TYPE does not represent the ESC data (4) code, the process proceeds to step S151. In step S151, similarly to step S146 to step S148, the code format generating unit 303 receives the ESC data TYPE, the intermediate code TYPE, the matching position Address, the matching length Leng, and the ESC data that are next output from the ESC data TYPE generating unit 302 in step S111 or step S116 in the flowchart of FIG. 7. The code format generating unit 303 sets the received ESC data as ESC data #4, and the process proceeds to step S152.

In step S152, similarly, the code format generating unit 303 receives the ESC data TYPE, the intermediate code TYPE, the matching position Address, the matching length Leng, and the ESC data that are next output from the ESC data TYPE generating unit 302 in step S111 or step S116 in the flowchart of FIG. 7. The code format generating unit 303 sets the received ESC data as ESC data #5, and the process proceeds to step S153.

In step S153, similarly, the code format generating unit 303 receives the ESC data TYPE, the intermediate code TYPE, the matching position Address, the matching length Leng, and the ESC data that are next output from the ESC data TYPE generating unit 302 in step S111 or step S116 in the flowchart of FIG. 7. The code format generating unit 303 sets the received ESC data as ESC data #6, and the process proceeds to step S154.

In step S154, similarly, the code format generating unit 303 receives the ESC data TYPE, the intermediate code TYPE, the matching position Address, the matching length Leng, and the ESC data that are next output from the ESC data TYPE generating unit 302 in step S111 or step S116 in the flowchart of FIG. 7. The code format generating unit 303 sets the received ESC data as ESC data #7, and the process proceeds to step S155.

In step S155, code data is generated according to the code format of the ESC data (8) code illustrated at (d) in FIG. 5. In further detail, the ESC data (8) code is generated by setting the header value to "11" and sequentially connecting the 8 ESC data received in step S140, step S146 to step S148, and step S151 to step S154 to the header. Then, the process proceeds to step S156.

In step S156, it is judged whether or not the process has been finished on all of the intermediate codes to be processed. When it is judged that the process has been finished on all of the intermediate codes, a series of processes in the flowchart of FIG. 9 is finished. However, when it is judged that the intermediate code that has not been processed yet is present among the intermediate codes to be processed, the process returns to step S140.

Decoding Process According to First Embodiment

Figure 10:
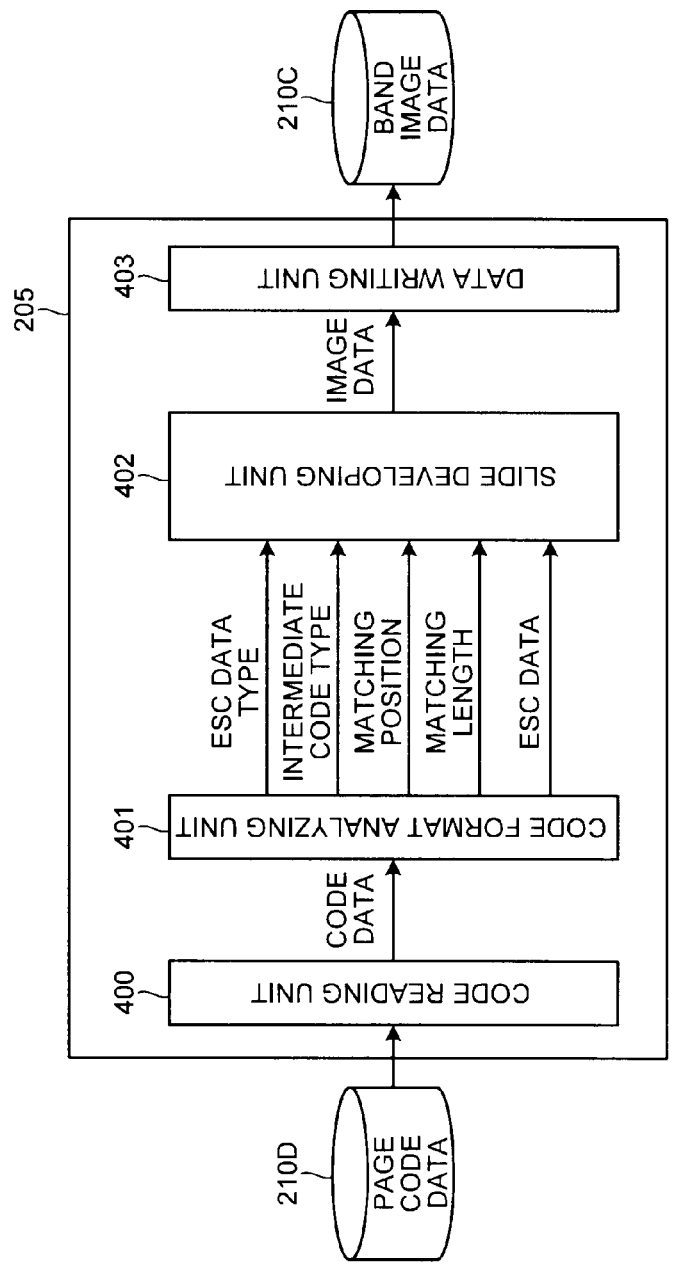
FIG. 10 is a block diagram schematically illustrating an exemplary configuration of a decoding unit according to the first embodiment.

FIG. 10 schematically illustrates an exemplary configuration of the decoding unit 205 according to the present first embodiment. In the decoding unit 205, a code reading unit 400 reads the code data encoded by the encoding unit 204 from the CMYK page code storage area 210D in the main memory 210. The code data read by the code reading unit 400 is supplied to a code format analyzing unit 401.

The code format analyzing unit 401 analyzes the supplied code data according to the code formats described with reference to (a) to (d) in FIG. 5 and extracts the ESC data TYPE, the intermediate code TYPE, the matching position Address, the matching length Leng, and the ESC data. The extracted data is supplied to a slide development unit 402.

The slide development unit 402 includes a slide storage unit that includes a plurality of registers that are serially connected to have a FIFO configuration. Each register is referred to as a slide and is configured to store data of one unit (for example, 8 bits). A slide among a plurality of slides that is X-th from the front is described as a slide "X" as appropriate. The slide development unit 402 develops data on each slide in a slide storage unit based on the supplied ESC data TYPE, the intermediate code TYPE, the matching position Address, the matching length Leng, and the ESC data and decodes the code data into image data. The image data decoded by the slide development unit 402 is supplied to a data writing unit 403 and written in the band image data storage area 210C in the main memory 210.

Figure 11:
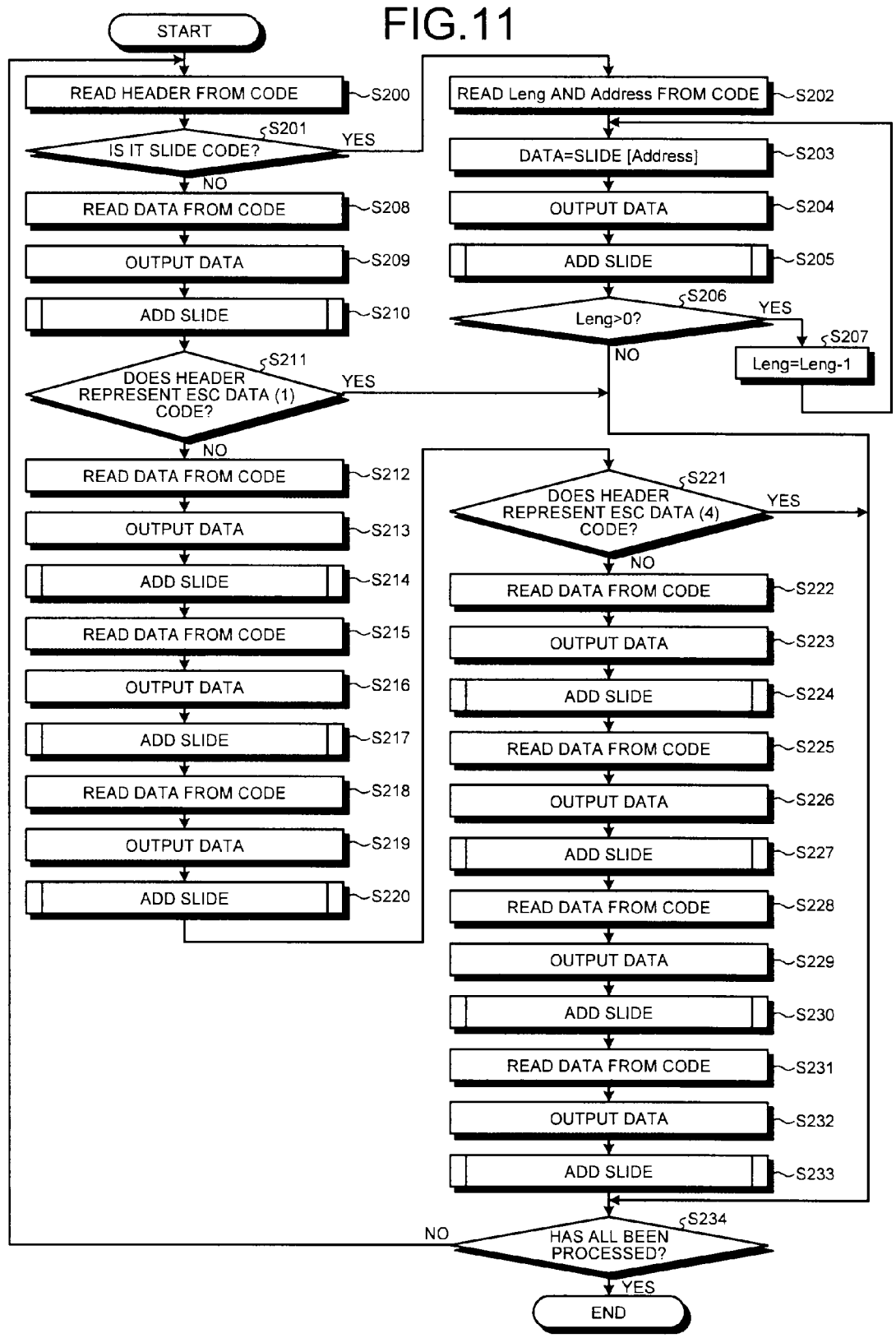
FIG. 11 is a flowchart illustrating an example of a decoding process according to the first embodiment.

FIG. 11 is a flowchart illustrating an example of a decoding process in the decoding unit 205. First, in step S200, the code format analyzing unit 401 segments 2 bits at the front of the code data received from the code reading unit 400 to read a header. Next, in step S201, the code format analyzing unit 401 judges whether or not the read header represents the slide code. When it is judged that the header value is "00" and the header represents the slide code, the process proceeds to step S202.

In step S202, the code format analyzing unit 401 segments 16 bits following the header of the code data, read the matching position Address and the matching length Leng from the code data, and transfers the matching position Address and the matching length Leng to the slide development unit 402. Next, in step S203, the slide development unit 402 reads data from the slide designated by the matching position Address, and in step S204, outputs the read data. In step S205, the output data is added to the slide and transferred to the data writing unit 403.

Figure 12:
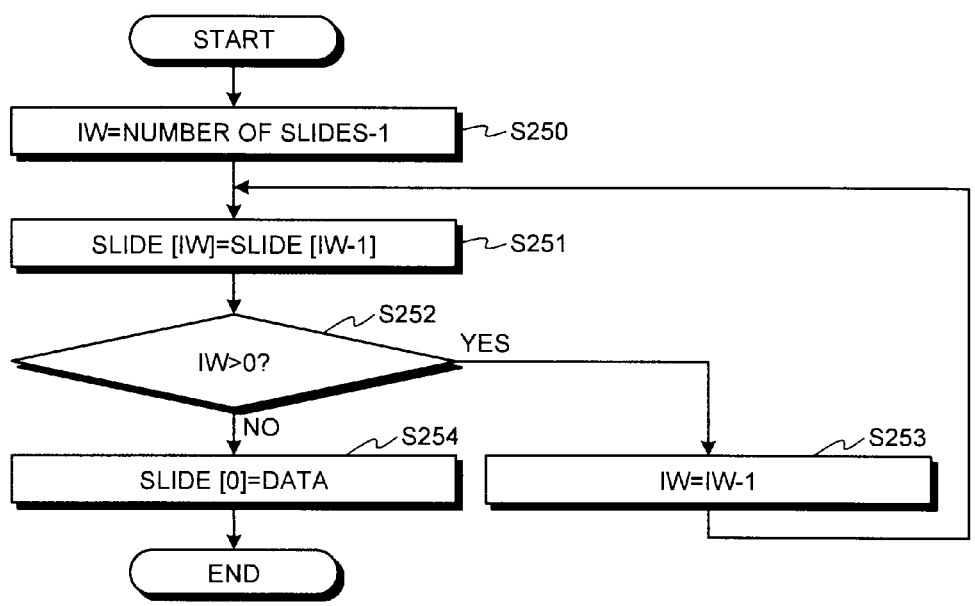
FIG. 12 is a flowchart illustrating an example of a slide addition process.

FIG. 12 is a flowchart illustrating an example of a slide addition process in step S205. First, in step S250, the slide development unit 402 sets a variable IW to a value obtained by subtracting one from the number of slides. Next, in step S251, a value of the slide [IW−1] is stored in the slide [IW], and in step S252, it is judged whether or not the variable IW is larger than zero. When it is judged that the variable IW is larger than "zero," the process proceeds to step S253, one is subtracted from the variable IW, and then the process returns to step S251. However, when it is judged that the variable IW is equal to or less than zero, the process proceeds to step S254, and the data output in step S204 is stored in the slide [0].

Returning back to the flowchart of FIG. 11, when slide addition is performed in step S205, the process proceeds to step S206, and it is judged whether or not the matching length Leng is larger than zero. When it is judged that the matching length Leng is not larger than zero, that is, the matching length Leng is zero, the process proceeds to step S234. However, when it is judged that the matching length Leng is larger than zero, in step S207, a value obtained by subtracting one from the matching length Leng is set as a new matching length Leng, and the process returns to step S203.

Meanwhile, when it is judged in step S201 that the header read in step S200 does not represent the slide code, the process proceeds to step S208. In this case, the header value is any one of "01," "10," and "11" and represents the ESC data code.

In step S208, the code format analyzing unit 401 reads 8 bits following the header of the code data and outputs the read data in next step S209. In step S210, in a manner as described above with reference to FIG. 12, the data output in step S209 is added to the slide. When addition of data to the slide is performed, the process proceeds to step S211.

In step S211, the code format analyzing unit 401 judges whether or not the header read in step S200 represents the ESC data (1) code. When it is judged that the header value is "01" and the header represents the ESC data (1) code, the process proceeds to step S234.

Meanwhile, when it is judged in step S211 that the header value is any one of "10" and "11" and the header does not represent the ESC data (1) code, the process proceeds to step S212. In step S212, code data of 8 bits following the code data read in step S208 is read, and, in step S213, the read code data is output. Next, in step S214, in a manner as described above with reference to FIG. 12, the data output in step S213 is added to the slide.

Next, in step S215, code data of 8 bits following the code data read in step S212 is read, and, in step S216, the read code data is output. Next, in step S217, in a manner as described above with reference to FIG. 12, the data output in step S216 is added to the slide.

Next, in step S218, code data of 8 bits following the code data read in step S215 is read, and, in step S219, the read code data is output. Next, in step S220, in a manner as described above with reference to FIG. 12, the data output in step S219 is added to the slide.

When addition of data to the slide in step S220 is performed, the process proceeds to step S221. In step S221, the code format analyzing unit 401 judges whether or not the header read in step S200 represents the ESC data (4) code. When it is judged that the header value is "10" and the header represents the ESC data (4) code, the process proceeds to step S234.

Meanwhile, when it is judged in step S221 that the header does not represent the ESC data (4) code, the process proceeds to step S222. In this case, the header value is "11." In step S222, code data of 8 bits following the code data read in step S218 is read, and, in step S223, the read code data is output. Next, in step S224, as described above with reference to FIG. 12, the data output in step S223 is added to the slide.

Next, in step S225, code data of 8 bits following the code data read in step S222 is read, and, in next step S226, the read code data is output. Next, in step S227, in a manner as described above with reference to FIG. 12, the data output in step S226 is added to the slide.

Next, in step S228, code data of 8 bits following the code data read in step S225 is read, and, in step S229, the read code data is output. Next, in step S230, in a manner as described above with reference to FIG. 12, the data output in step S229 is added to the slide.

Next, in step S231, code data of 8 bits following the code data read in step S228 is read, and, in next step S232, the read code data is output. Next, in step S233, in a manner as described above with reference to FIG. 12, the data output in step S232 is added to the slide.

In step S234, the decoding unit 205 judges whether or not the process on all code data to be decoded has been finished. When it is judged that the code data that has not been processed yet is present, the process returns to step S200, and next 2 bits of the code data is read to read the header is performed. However, when it is judged that the process on all code data to be decoded has been finished, a series of processes according to the flowchart of FIG. 11 is finished.

Second Embodiment

Next, a second embodiment of the present invention will be described. In the above described first embodiment, a plurality of types of sets between which the number of successive repetitions of the ESC data takes discrete values has been defined, and the plurality of types of sets has been identified by the header value. On the other hand, in the present second embodiment, a header representing a number of successive repetitions of ESC data is added to corresponding set of the number of consecutive ESC data.

Figure 13:
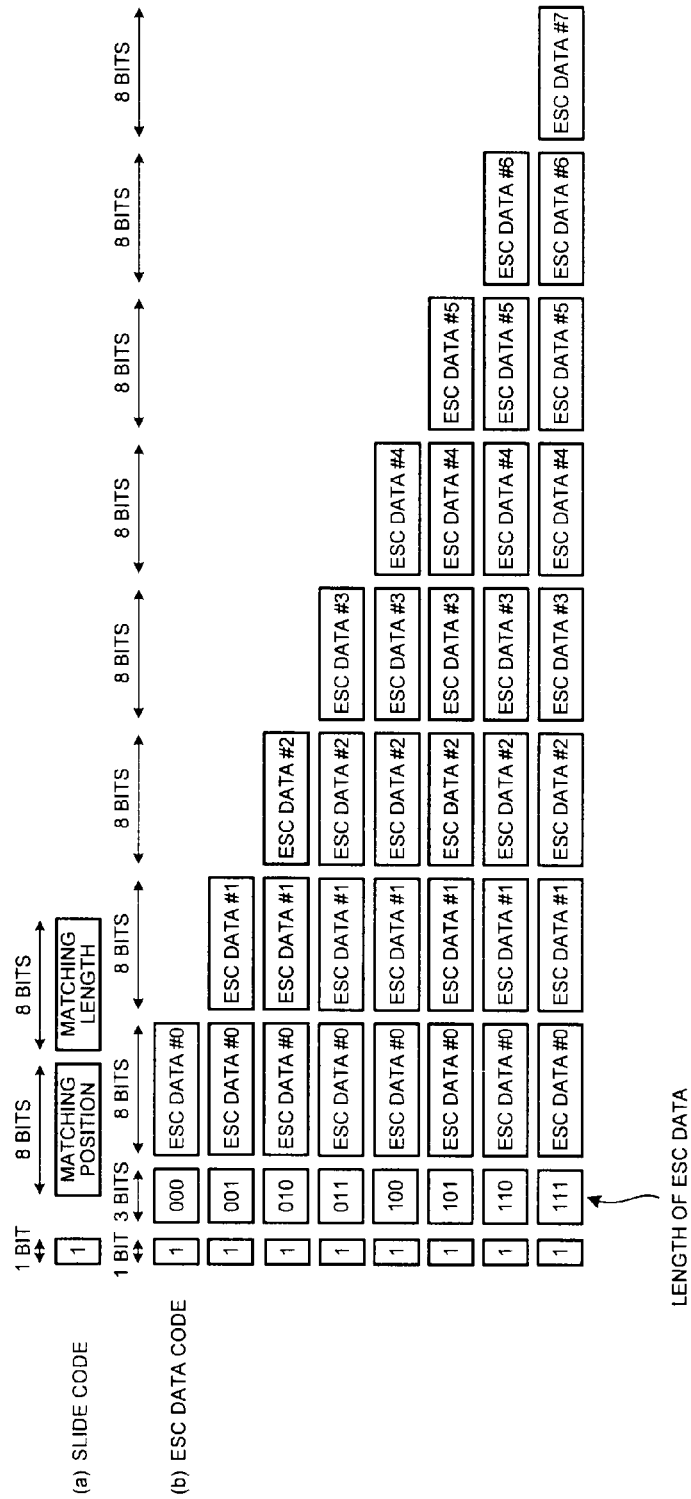
FIG. 13 is a schematic diagram illustrating an example of a code format according to a second embodiment.

FIG. 13 illustrates an example of a code format according to the present second embodiment. In the present second embodiment, information of one bit representing which one of the slide code and the ESC data code the code data represents is added as the header. At (a) in FIG. 13, an example of the slide code is illustrated. The header value is "0" that represents the slide code. The matching position Address and the matching length Leng that each have the data length of, for example, 8 bits are connected to the header.

At (b) in FIG. 13, an example of the ESC data code is illustrated. A header value is "1" that represents the ESC data code. Following the header, a 3-bit code representing the number of successive repetitions of the ESC data is added. In the example at (b) in FIG. 13, a value of the 3-bit code is "000" to "111" that represent that the number of successive repetitions of the ESC data is 1 to 8, respectively. The ESC data of the number represented by the code is added to the 3-bit code, thereby configuring the ESC data code.

Further, 9 or more consecutive ESC data can be expressed by appropriately combining the ESC data codes representing the number of successive repetitions of 1 to 8. The code length of the code representing the number of successive repetitions of the ESC data is not limited to 3 bits and may be 2, 4, or more bits.

Encoding Process According to Second Embodiment

Figure 14:
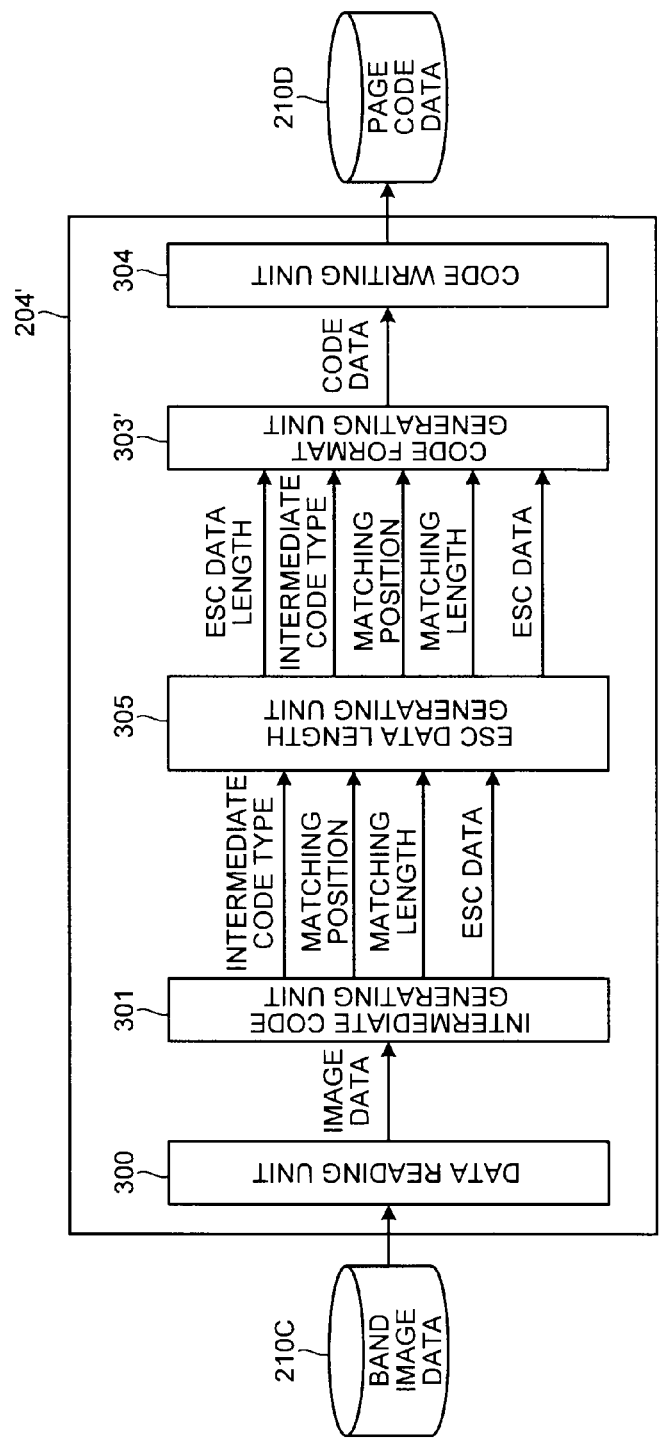
FIG. 14 is a block diagram illustrating an exemplary configuration of an encoding unit according to the second embodiment.

FIG. 14 illustrates an exemplary configuration of an encoding unit 204' according to the present second embodiment. The encoding unit 204' corresponds to the encoding unit 204 in the above described first embodiment. In FIG. 14, parts that are in common with FIG. 4 are denoted by the same reference numerals, and a detailed description thereof will be omitted.

The encoding unit 204' includes the data reading unit 300, the intermediate code generating unit 301, an ESC data length generating unit 305, a code format generating unit 303', and the code writing unit 304. In the encoding unit 204', the CMYK band image data read from the CMYK band image data storage area 210C in the main memory 210 by the data reading unit 300 is supplied to the intermediate code generating unit 301. The intermediate code generating unit 301 sequentially compares the supplied image data with past input data stored in the slide storage unit and outputs the intermediate code TYPE, the matching position Address, the matching length Leng, and the ESC data based on the comparison result. As described above, the intermediate code TYPE represents whether or not a data string from the supplied image data matches a data string from the past input data stored in the slide storage unit.

The values output from the intermediate code generating unit 301 are supplied to the ESC data length generating unit 305. The ESC data length generating unit 305 counts a number of successive repetitions of an intermediate code TYPE representing a mismatch and outputs a count value as an ESC data length. In this example, the upper limit of the ESC data length is set to 8, and when the number of successive repetitions of the intermediate code TYPE exceeds 8, the count value is reset to zero, and a count is resumed.

The ESC data length generating unit 305 outputs the generated ESC data length and also outputs the ESC data, the matching position Address, the matching length Leng, and the intermediate code TYPE, which are supplied from the intermediate code generating unit 301, to supply these to the code format generating unit 303'. The code format generating unit 303' performs encoding with the supplied ESC data, the matching position Address, the matching length Leng, the intermediate code TYPE, and the ESC data length according to the format described with reference to FIG. 13.

The slide code and the ESC data code generated by the code format generating unit 303' are supplied to the code writing unit 304 and written in the CMYK page code storage area 210D in the main memory 210.

Figure 15:
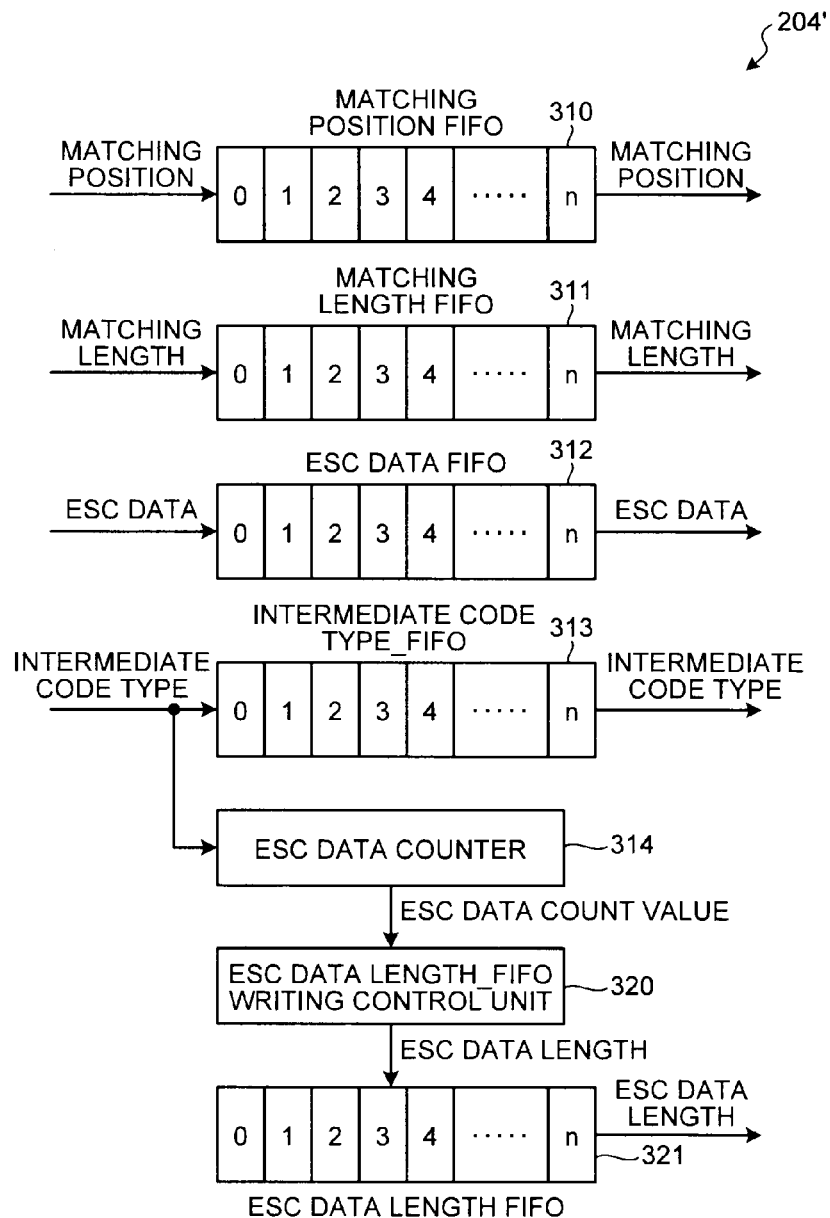
FIG. 15 illustrates an exemplary configuration of an ESC data length generating unit.

FIG. 15 illustrates an exemplary configuration of the ESC data length generating unit 305. In FIG. 15, parts that are in common with FIG. 6 are denoted by the same reference numerals, and a detailed description thereof will be omitted. The ESC data length generating unit 305 includes the matching position FIFO 310, the matching length FIFO 311, the ESC data FIFO 312, the intermediate code TYPE_FIFO 313, and an ESC data length_FIFO 321, which are buffer memories having a FIFO type. The ESC data length generating unit 305 further includes the ESC data counter 314 and an ESC data length_FIFO writing control unit 320. The ESC data counter 314 counts a number of successive repetitions of the intermediate code TYPE representing a mismatch and outputs a count value as a value representing the ESC data length (hereinafter, ESC data length).

In the ESC data length_FIFO 321, an ESC data length is stored, and writing and outputting of data are performed in units of the ESC data length (for example, 8 bits). The ESC data length_FIFO 321 is controlled by the ESC data length_FIFO writing control unit 320 so that writing and reading is performed in synchronization with the matching position FIFO 310, the matching length FIFO 311, the ESC data FIFO 312, and the intermediate code TYPE_FIFO 313. That is, the ESC data length_FIFO writing control unit 320 controls the ESC data length_FIFO 321 so that writing and reading is performed in synchronization with an output of the intermediate code generating unit 301.

The ESC data counter 314 counts the number of successive repetitions of the ESC data based on the value of the intermediate code TYPE and transmits the ESC data length, which is obtained by counting the number of successive repetitions of the ESC data, to the ESC data length_FIFO writing control unit 320 when consecution of the ESC data is disrupted. The ESC data length_FIFO writing control unit 320 writes the ESC data length transmitted from the ESC data counter 314 at the position, depending on the ESC data length, in the ESC data length_FIFO 321 as will be described later.

Figure 16:
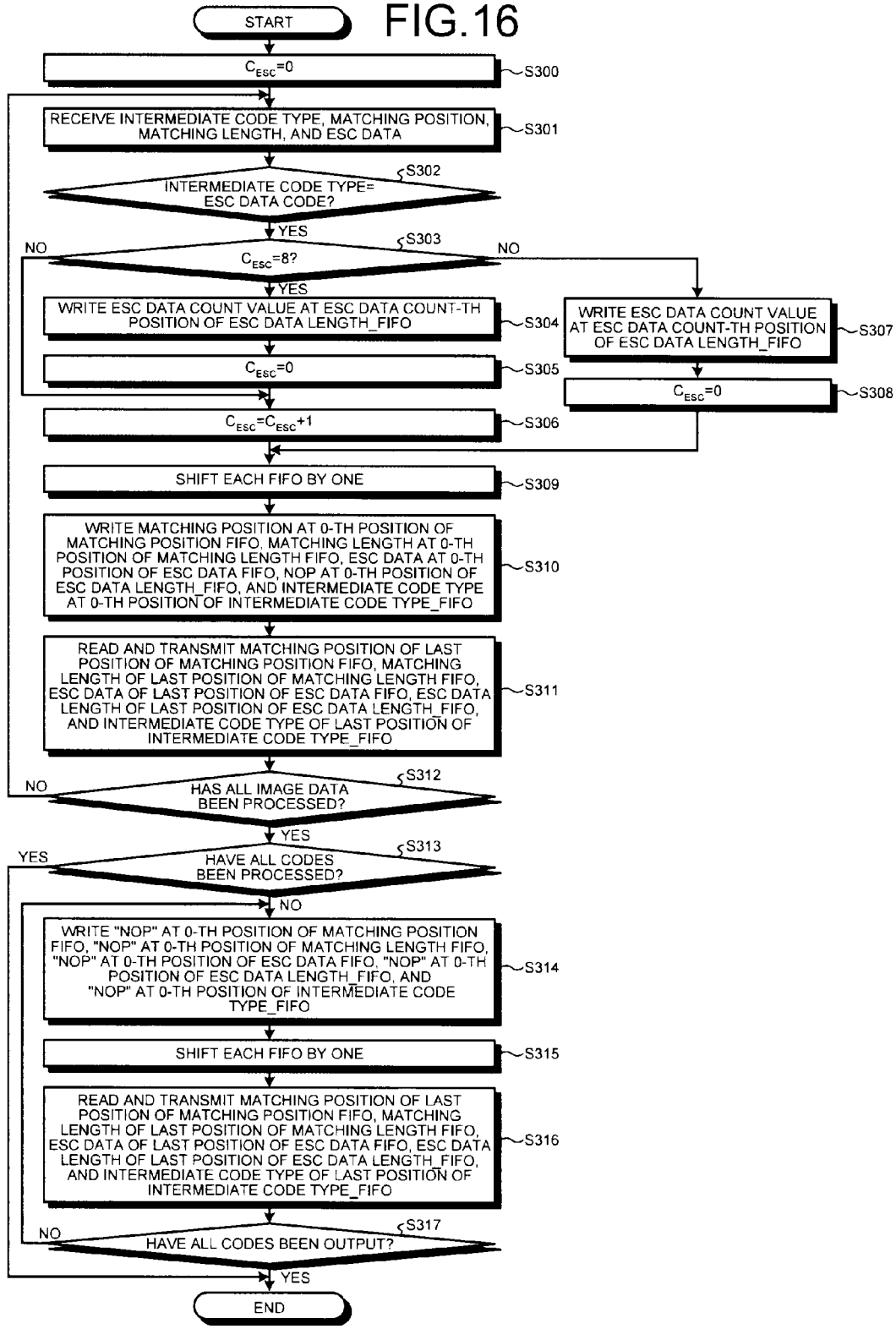
FIG. 16 is an exemplary flowchart illustrating an ESC data length generation process.

FIG. 16 is a flowchart illustrating an example of an ESC data length generation process in the ESC data length generating unit 305. Here, it is assumed that the upper limit value of the ESC data length is 8. In first step S300, the ESC data count value $C_{ESC}$ in the ESC data counter 314 is initialized to zero (0).

In step S301, the ESC data length generating unit 305 receives the intermediate code TYPE, the matching position Address, the matching length Leng, and the ESC data from the intermediate code generating unit 301. In next step S302, the ESC data length generating unit 305 judges whether or not the received intermediate code TYPE represents the ESC data code. When it is judged that the received intermediate code TYPE represents the ESC data code, the process proceeds to step S303, and it is judged whether or not the ESC data count value $C_{ESC}$ is 8 that is the upper limit value of the ESC data length.

When it is judged in step S303 that the ESC data count value $C_{ESC}$ is not 8, the process proceeds to step S306, and the ESC data count value $C_{ESC}$ increases by one.

However, when it is judged in step S303 that the ESC data count value $C_{ESC}$ is 8, the process proceeds to step S304. In step S304, the ESC data length_FIFO writing control unit 320 writes the ESC data count value $C_{ESC}$ at the position, (the ESC data count-th position) represented by the ESC data count value $C_{ESC}$, in the ESC data length_FIFO 321.

Next, in step S305, the ESC data count value $C_{ESC}$ is reset to zero. In step S306, the ESC data count value $C_{ESC}$ increases by one, and the process proceeds to step S309.

Meanwhile, when it is judged in the abovementioned step S302 that the intermediate code TYPE does not represent the ESC data code, the process proceeds to step S307. In step S307, the ESC data count value $C_{ESC}$ is written at the position (the ESC data count-th position), represented by the ESC data count value $C_{ESC}$, in the ESC data length_FIFO 321. Next, in step S308, the ESC data count value $C_{ESC}$ is reset to zero, and the process proceeds to step S309.

In step S309, the ESC data length generating unit 305 shifts the matching position FIFO 310, the matching length FIFO 311, the ESC data FIFO 312, the intermediate code TYPE_FIFO 313, and the ESC data length_FIFO 321 by one (one unit), respectively.

Next, in step S310, the ESC data length generating unit 305 writes the data supplied from the intermediate code generating unit 301 in the FIFOs, respectively. That is, the ESC data length generating unit 305 writes the matching position Address at the 0-th position in the matching position FIFO 310 and writes the matching length Leng at the 0-th position in the matching length FIFO 311. Further, the ESC data length generating unit 305 writes the ESC data at the 0-th position in the ESC data FIFO 312 and writes the intermediate code TYPE at the 0-th position in the intermediate code TYPE_FIFO 313. Further, in the ESC data length generating unit 305, the ESC data length_FIFO writing control unit 320 writes a value representing NOP at the 0-th position in the ESC data length_FIFO 321.

Next, in step S311, the ESC data length generating unit 305 reads the data stored at the end (the last position) in the FIFOs and transmits the data to the code format generating unit 303'. That is, the ESC data length generating unit 305 reads the matching position Address from the last position in the matching position FIFO 310 and the matching length Leng from the last position of the matching length FIFO 311, respectively, and transmits the matching position Address and the matching length Leng to the code format generating unit 303'. Further, the ESC data length generating unit 305 reads the ESC data from the last position in the ESC data FIFO 312 and the intermediate code TYPE from the last position in the intermediate code TYPE_FIFO 313, respectively, and transmits the ESC data and the intermediate code TYPE to the code format generating unit 303'. Further, the ESC data length generating unit 305 reads the ESC data length from the last position in the ESC data length_FIFO 321 and transmits the ESC data length to the code format generating unit 303'.

Next, in step S312, it is judged whether or not all image data to be processed has been processed. When it is judged that the image data that has not been processed is present, the process returns to step S301. However, when it is judged that all image data to be processed has been processed, the process proceeds to step S313, and it is judged whether or not all of the codes inside the FIFOs including the matching position FIFO 310, the matching length FIFO 311, the ESC data FIFO 312, the intermediate code TYPE_FIFO 313, and the ESC data length_FIFO 321 have been output. When it is judged that all of the codes have been output, a series of processes according to the flowchart of FIG. 16 is finished.

However, when it is judged that the code that has not been output is present, the process proceeds to step S314. In step S314, the ESC data length generating unit 305 writes a value representing NOP at the front, that is, the 0-th position in each of the matching position FIFO 310, the matching length FIFO 311, the ESC data FIFO 312, and the intermediate code TYPE_FIFO 313. Further, in the ESC data length generating unit 305, the ESC data length_FIFO writing control unit 320 writes a value representing NOP at the 0-th position in the ESC data length_FIFO 321.

When the value representing NOP is written at the 0-th position in each of the FIFOs, in next step S315, the ESC data length generating unit 305 shifts the matching position FIFO 310, the matching length FIFO 311, the ESC data FIFO 312, the intermediate code TYPE_FIFO 313, and the ESC data length_FIFO 321 by one (one unit), respectively.

In step S316, the ESC data length generating unit 305 reads the matching position Address from the last position in the matching position FIFO 310, the matching length Leng from the last position in the matching length FIFO 311, the ESC data from the last position in the ESC data FIFO 312, the intermediate code TYPE from the last position in the intermediate code TYPE_FIFO 313, and the ESC data length from the last position in the ESC data length_FIFO 321, respectively. Further, the ESC data length generating unit 305 transmits the matching position Address, the matching length Leng, the ESC data, the intermediate code TYPE, and the ESC data length to the code format generating unit 303'.

In next step S317, it is judged whether or not all of the codes, which are respectively written in the matching position FIFO 310, the matching length FIFO 311, the ESC data FIFO 312, the intermediate code TYPE_FIFO 313, and the ESC data length_FIFO 321, have been output. When it is judged that all of the codes have been output, a series of processes according to the flowchart of FIG. 16 is finished. However, when it is judged that the codes inside the FIFOs have not been completely output yet, the process returns to step S314.

Figure 17:
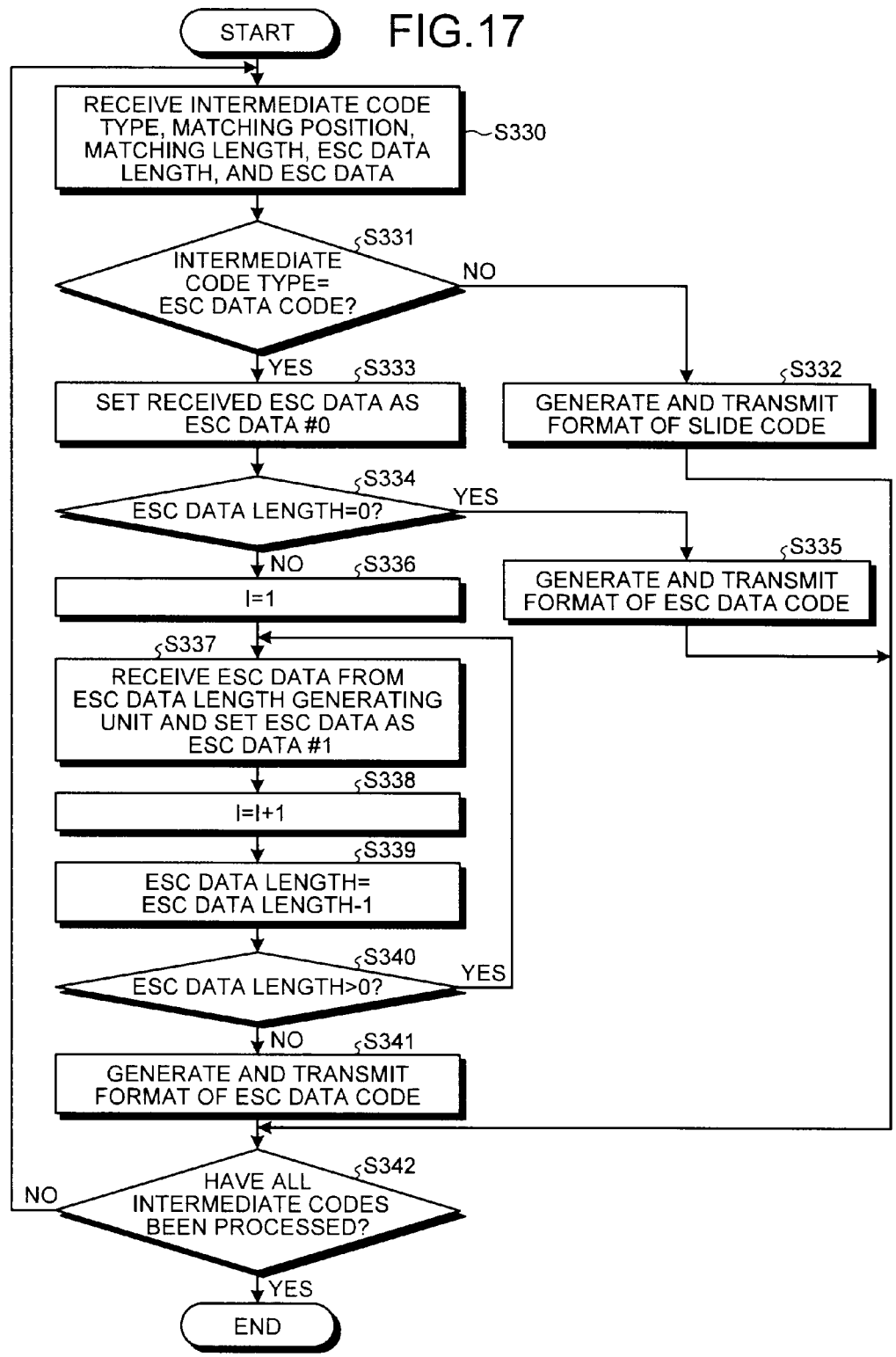
FIG. 17 is a flowchart illustrating an example of a code format generation process according to the second embodiment.

FIG. 17 is a flowchart illustrating an example of a code format generation process in the code format generating unit 303'. First, in step S330, the code format generating unit 303' receives the ESC data length, the intermediate code TYPE, the matching position Address, the matching length Leng, and the ESC data from the ESC data length generating unit 305. In step S331, it is judged whether or not the received intermediate code TYPE represents the ESC data code.

When it is judged in step S331 that the received intermediate code TYPE does not represent the ESC data code, the process proceeds to step S332. In step S332, the header value is set to "0," and code data is generated, according to the code format of the slide code illustrated at (a) in FIG. 13, based on the matching position Address and the matching length Leng. The code format generating unit 303' transmits the generated code data to the code writing unit 304, and the process proceeds to step S342.

Meanwhile, when it is judged in step S331 that the received intermediate code TYPE represents the ESC data code, the process proceeds to step S333. In step S333, the code format generating unit 303' sets the ESC data received from the ESC data length generating unit 305 in step S330 as first ESC data, that is, ESC data #0, and the process proceeds to step S334.

In step S334, the code format generating unit 303' judge whether or not the ESC data length (in the drawings, denoted as $L_{ESC}$ as appropriate) is zero (0). When it is judged that the ESC data length is zero, the process proceeds to step S335, and, as illustrated at (b) in FIG. 13, the code data is generated according to the code format of the ESC data code. In further detail, the ESC data code is generated by setting the header value to "1" and connecting the ESC data received in step S330 to the header. Then, the process proceeds to step S342.

Meanwhile, when it is judged in step S334 that the ESC data length is not zero, the process proceeds to step S336, and a variable I is initialized to zero. Next, in step S337, the code format generating unit 303' receives the ESC data from the ESC data length generating unit 305 and sets the received ESC data as I-th ESC data (ESC data #I).

The process proceeds to step S338, and the code format generating unit 303' increases the variable I by one. In next step S339, a value obtained by subtracting one from the ESC data length is set as new ESC data length. In step S340, the code format generating unit 303' judges whether or not the ESC data length is larger than zero. When it is judged that the ESC data length is larger than zero, the process returns to step S337.

Meanwhile, when it is judged in step S340 that the ESC data length is equal to or less than zero, the process proceeds to step S341, and, as illustrated at (b) in FIG. 13, the code data is generated according to the code format of the ESC data code. In further detail, the ESC data code is generated by setting the header value to "1" and sequentially connecting the ESC data received in step S337 to the header. For example, when the variable I is 5, the ESC data code is generated by sequentially connecting 5 consecutive ESC data to the header. Then, the process proceeds to step S342.

In step S342, it is judged whether or not the process has been finished on all of the intermediate codes to be processed. When it is judged that the process has been finished on all of the intermediate codes, a series of processes in the flowchart of FIG. 17 is finished. However, when it is judged that the intermediate code that has not been processed yet is present among the intermediate codes to be processed, the process returns to step S330.

Alternatively, when the upper limit value of the ESC data length is set, in the abovementioned step S340, it may be judged whether or not the ESC data length is larger than zero and equal to or less than the upper limit value. In this case, when it is judged that the ESC data length is larger than zero and equal to or less than the upper limit value, the process returns to step S337. However, when it is judged that the ESC data length is equal to or less than zero or larger than the upper limit value, the process proceeds to step S341.

Decoding Process According to Second Embodiment

Figure 18:
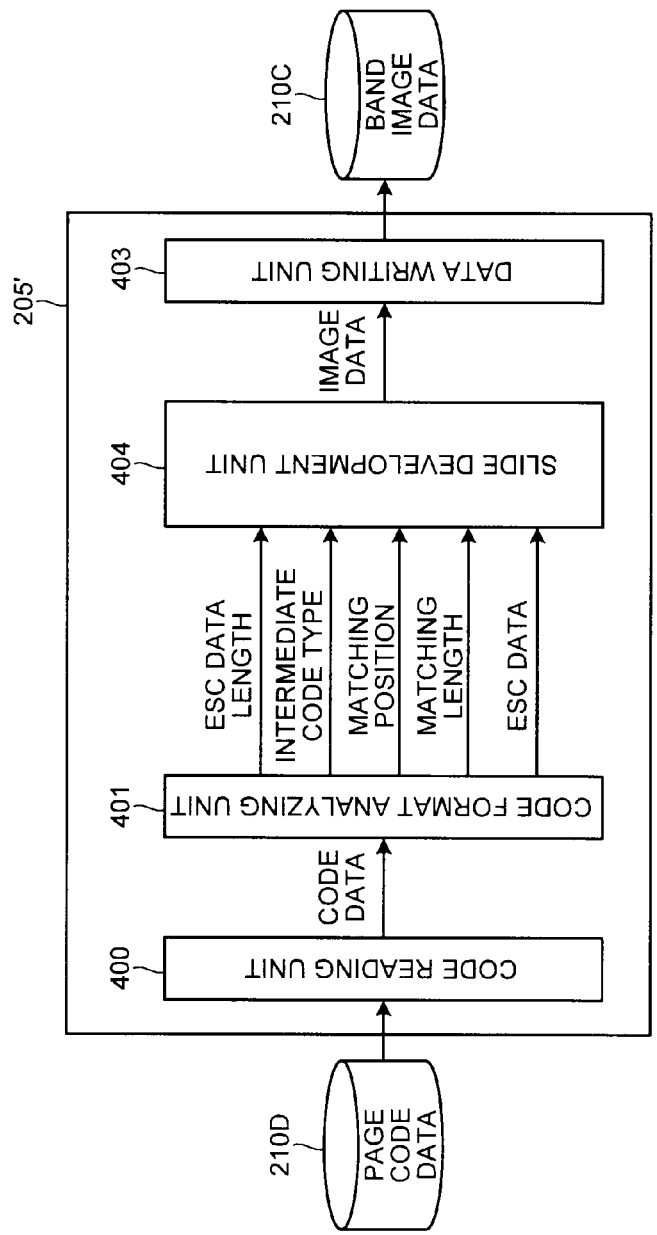
FIG. 18 is a block diagram schematically illustrating an exemplary configuration of a decoding unit according to the second embodiment.

FIG. 18 schematically illustrates an exemplary configuration of a decoding unit 205' according to the present second embodiment. The decoding unit 205' corresponds to the decoding unit 205 in the above described first embodiment. In FIG. 18, parts that are in common with FIG. 10 are denoted by the same reference numerals, and a detailed description thereof will be omitted.

In the decoding unit 205, the code reading unit 400 reads the code data encoded by the encoding unit 204 from the page code storage area 210D in the main memory 210. The read code data is supplied to a code format analyzing unit 401. The code format analyzing unit 401 analyzes the supplied code data according to the code formats described with reference to (a) and (b) in FIG. 13 and extracts the ESC data length, the intermediate code TYPE, the matching position Address, the matching length Leng, and the ESC data. The extracted data is supplied to a slide development unit 404.

The slide development unit 404 develops data on each slide in the slide storage unit based on the supplied ESC data length, the intermediate code TYPE, the matching position Address, the matching length Leng, and the ESC data and decodes the code data into image data. The image data decoded by the slide development unit 404 is supplied to the data writing unit 403 and written in the band image data storage area 210C in the main memory 210.

Figure 19:
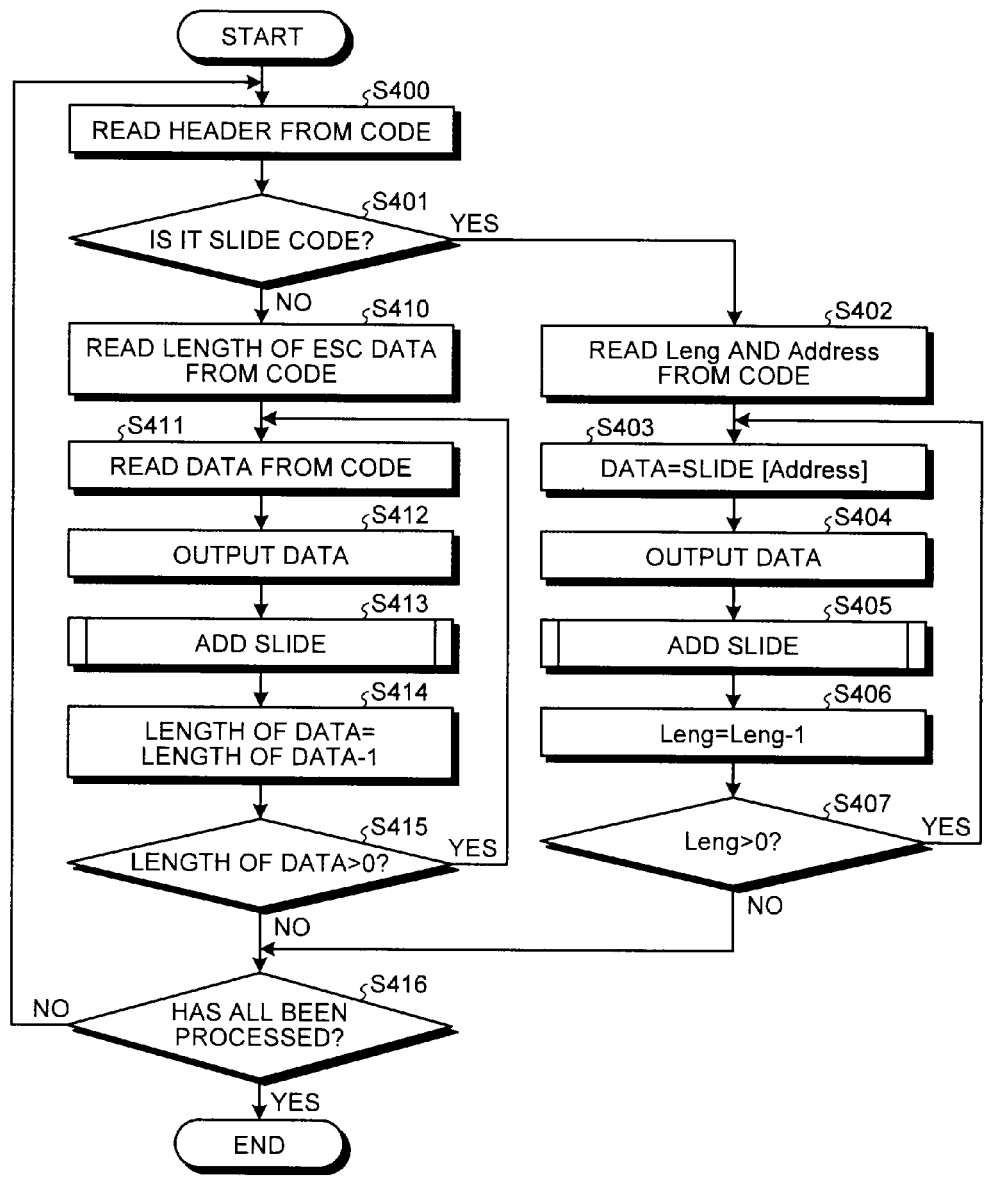
FIG. 19 is a flowchart illustrating an example of a decoding process according to the second embodiment.

FIG. 19 is a flowchart illustrating an example of a decoding process in the decoding unit 205. First, in step S400, the code format analyzing unit 401 segments 1 bit of the front of the code data received from the code reading unit 400 to read the header. Next, in step S401, the code format analyzing unit 401 judges whether or not the read header represents the slide code. When it is judged that the header value is "0" and the header represents the slide code, the process proceeds to step S402.

In step S402, the code format analyzing unit 401 segments 16 bits following the header of the code data to read the matching position Address and the matching length Leng from the code data, and transfers the matching position Address and the matching length Leng to the slide development unit 404. Next, in step S403, the slide development unit 404 reads data from the slide designated by the matching position Address, and in next step S404, outputs the read data. In step S405, in a manner as illustrated in FIG. 12, the output data is added to the slide and transferred to the data writing unit 403.

Next, in step S406, a value obtained by subtracting one from the matching length Leng is set as a new matching length Leng. In step S407, it is judged whether or not the matching length Leng is larger than zero. When it is judged that the matching length Leng is not larger than zero, that is, the matching length Leng is zero, the process proceeds to step S416. However, when it is judged that the matching length Leng is larger than zero, the process returns to step S403.

Meanwhile, when it is judged in the abovementioned step S401 that the header read in step S400 does not represent the slide code, the process proceeds to step S410. In step S410, the code format analyzing unit 401 reads 3 bits following the header of the code data to obtain the ESC data length.

Next, in step S411, the code format analyzing unit 401 reads next 8-bit data from the code data, and, in step S412, outputs the read data. In step S413, in a manner as described above with reference to FIG. 12, the output data is added to the slide and transferred to the data writing unit 403.

Next, in step S414, a value obtained by subtracting one from the ESC data length is set as a new ESC data length. In step S415, it is judged whether or not the ESC data length is larger than zero. When it is judged that the ESC data length is larger than zero, the process returns to step S411 and next data is read from the code data.

However, when it is judged in step 415 that the ESC data length is not larger than zero, that is, the ESC data length is zero, the process proceeds to step S416. In step S416, the decoding unit 205' judges whether or not the process on all code data to be decoded has been finished. When it is judged that the code data that has not be processed yet is present, the process returns to step S400, and the process on the next code is performed. However, when it is judged in step 416 that the process on all code data to be decoded has been finished, a series of processes according to the flowchart of FIG. 19 is finished.

As described above, according to the embodiments of the present invention, regarding the ESC data generated when compression coding is performed by the LZ scheme, one header is added collectively to a plurality of ESC data. For this reason, compared to the case in which one header is added to one ESC data, the worst compression rate can increase, that is, the code amount can be reduced. Accordingly, it is possible to increase the speed of the decoding process of the code data in which the image data is compression-encoded, and even in the case of printing image data having bad compression efficiency, printing can be guaranteed.

Further, according to the embodiments, the matching position Address, the matching length Leng, and the ESC data that are generated by encoding by the LZ scheme are written in buffers of the FIFO type, respectively, as the intermediate codes. In addition, the count value obtained by counting a number of ESC data that are successively repeated, that is, the number of successive repetitions of the ESC data, is written at the address, which corresponds to the front of the consecutive ESC data, in the buffer of the FIFO type that is in synchronization with the FIFO buffer that stores the intermediate code. The matching position Address, the matching length Leng, the ESC data, and the number of successive repetitions of the ESC data c are read from the buffer to perform encoding.

As a result, the encoding unit can be configured by using a small-size FIFO buffer. That is, the minimum size of each FIFO buffer is the size corresponding to the upper limit of the number of successive repetitions of the ESC data. Further, by configuring the buffer in the encoding unit according to the FIFO type, it is possible to perform a parallel operation of the process of generating the intermediate code of the LZ scheme and the process of generating the code data from the intermediate code, and thus the processing speed can be increased.

Furthermore, in the above described embodiments, in the intermediate code generating unit 301, when the supplied image data is matched with the past input data stored in the slide storage unit, encoding is performed by obtaining the matching position Address and the matching length Leng according to a run-length scheme, but the present invention is not limited to the above embodiments. For example, as disclosed in Japanese Patent No. 4000266, by, a MTF coding scheme that is a coding scheme of performing encoding by performing move to front (MTF) control on a small dynamic dictionary and using an index value matched with the dictionary may be used.

The embodiments have been described as being applied to the printer apparatus, but the present invention is not limited thereto. The embodiments of the present invention may be applied to a multifunction peripheral in which a scanner function, a printer function, a copy function, and a facsimile function are integrated inside a housing.

According to the present invention, there is an effect capable of effectively compressing and encoding image data.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An image processing apparatus, comprising:
   a search unit that searches for a data string that matches an input data string that is image data consecutively input, from data string of the image data input in the past;

an intermediate code generating unit that, when a data string that matches the input data string is found by the search unit, outputs a length of the found data string and a position of the found data string on the data string input in the past and, when a data string that matches with the input data string is not found, outputs the input data string as escape data;

a count unit that counts a number of successive outputs of the escape data from the intermediate code generating unit; and an encoding unit that performs encoding with the length of the found data string, the position of the found data string on the data string input in the past, and the escape data, wherein, when a plurality of the escape data are successively output from the intermediate code generating unit, the encoding unit encodes the plurality of escape data collectively by adding, to the plurality of the escape data, information representing a count value obtained by counting a number of the plurality of the escape data through the count unit.

2. The image processing apparatus according to claim 1, wherein the encoding unit performs encoding by dividing a plurality of the escape data successively output from the intermediate code generating unit into a plurality of types of sets of the escape data and adding, to each of the sets of the escape data, information representing the count value obtained by counting a number of the escape data constituting corresponding one of the sets through the count unit, different types of the sets being composed of different numbers, including two or more, of the escape data.

3. The image processing apparatus according to claim 1, further comprising:
a first storage unit of a First In First Out (FIFO) type that stores the length of the found data string, the position of the found data string on the data string input in the past, and the escape data output from the intermediate code generating unit;
a second storage unit of a FIFO type that stores the information representing the count value; and
a storage unit control unit that controls writing and reading with respect to the second storage unit so as to be performed in synchronization with an output of the intermediate code generating unit,
wherein the encoding unit performs encoding with the length of the found data string, the position of the found data string on the data string input in the past, and the escape data read from the first storage unit, and the information representing the count value read from the second storage unit.

4. The image processing apparatus according to claim 1, wherein the encoding unit performs encoding by combining the plurality of the escape data and the information representing the count value when the count value reaches a predetermined upper limit value, and
wherein the count unit resets the count value when the count value reaches the predetermined upper limit value.

5. An image processing method, comprising:
searching for, by a search unit, a data string that matches an input data string which is image data consecutively input, from data string of the image data input in the past;
generating, by an intermediate code generating unit, an intermediate code in such a manner that, when a data string that matches the input data string is found, the intermediate code generating unit outputs a length of the found data string and a position of the found data string on the data string input in the past and, when a data string that matches the input data string is not found, the intermediate code generating unit outputs the input data string as escape data;
counting, by a count unit, a number of successive outputs of the escape data from the intermediate code generating unit; and
performing encoding, by an encoding unit, with the length of the found data string, the position of the found data string on the data string input in the past, and the escape data,
wherein, when a plurality of the escape data are consecutively output by the generating the intermediate code, the plurality of the escape data are encoded collectively by adding, to the plurality of the escape data, information representing a count value obtained by counting a number of the plurality of the escape data through the count unit.

* * * * *